(12) United States Patent
Picciotto et al.

(10) Patent No.: US 7,391,090 B2
(45) Date of Patent: Jun. 24, 2008

(54) SYSTEMS AND METHODS FOR ELECTRICALLY COUPLING WIRES AND CONDUCTORS

(75) Inventors: Carl E. Picciotto, Menlo Park, CA (US); Peter George Hartwell, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/015,468

(22) Filed: Dec. 17, 2004

(65) Prior Publication Data

US 2006/0131677 A1   Jun. 22, 2006

(51) Int. Cl.
*H01L 29/00* (2006.01)
*H01H 59/00* (2006.01)

(52) U.S. Cl. .............. 257/415; 257/E29.342; 438/50; 361/207; 200/181

(58) Field of Classification Search ........... 361/207; 200/181; 257/415, E29.342; 438/50
See application file for complete search history.

(56) References Cited

U.S. PATENT DOCUMENTS

| | | | |
|---|---|---|---|
| 5,986,381 A | 11/1999 | Hoen et al. | |
| 6,069,540 A * | 5/2000 | Berenz et al. | 333/101 |
| 6,072,686 A | 6/2000 | Yarbrough | |
| 6,128,214 A | 10/2000 | Kuekes et al. | |
| 6,137,206 A | 10/2000 | Hill | |
| 6,256,767 B1 | 7/2001 | Kuekes et al. | |
| 6,314,019 B1 | 11/2001 | Kuekes et al. | |
| 6,366,186 B1 | 4/2002 | Hill et al. | |
| 6,396,368 B1 * | 5/2002 | Chow et al. | 333/262 |
| 6,426,687 B1 * | 7/2002 | Osborn | 333/262 |
| 6,433,657 B1 * | 8/2002 | Chen | 333/262 |
| 6,506,989 B2 * | 1/2003 | Wang | 200/181 |
| 6,509,620 B2 * | 1/2003 | Hartwell et al. | 257/415 |
| 6,511,894 B2 | 1/2003 | Song | |
| 6,512,119 B2 | 1/2003 | Bratkovski et al. | |
| 6,559,468 B1 | 5/2003 | Kuekes et al. | |
| 6,586,965 B2 | 7/2003 | Kuekes | |
| 6,587,021 B1 * | 7/2003 | Streeter | 333/262 |
| 6,624,002 B2 | 9/2003 | Bratkovski et al. | |
| 6,635,837 B2 * | 10/2003 | Subramanian et al. | 200/181 |
| 6,674,932 B1 | 1/2004 | Zhang et al. | |
| 6,746,891 B2 * | 6/2004 | Cunningham et al. | 438/52 |
| 6,753,488 B2 * | 6/2004 | Ono et al. | 200/181 |
| 6,760,245 B2 | 7/2004 | Eaton, Jr. et al. | |

(Continued)

FOREIGN PATENT DOCUMENTS

EP    1119012    7/2001

(Continued)

OTHER PUBLICATIONS

S. Hoen et al., "A High-Performance Dipole Surface Drive for Large Travel and Force", Transducers '03, The 12th International Conference on Solid State Sensors, Actuators and Microsystems, Boston, Jun. 8-Dec. 2003, pp. 344-347.

*Primary Examiner*—Bill Baumeister
*Assistant Examiner*—Steven J Fulk

(57) ABSTRACT

A first device includes a micrometer-scale or smaller geometry first conductor. A second device includes a micrometer-scale or smaller second conductor. An actuator the first and second devices relative to each other between first and second positions. Signals are substantially coupled between the first and second conductors in the first position and not in the second position.

51 Claims, 22 Drawing Sheets

U.S. PATENT DOCUMENTS

| | | | |
|---|---|---|---|
| 6,806,788 B1 * | 10/2004 | Marumoto | 333/101 |
| 6,876,282 B2 * | 4/2005 | Andricacos et al. | 335/78 |
| 6,967,548 B2 * | 11/2005 | Ma et al. | 333/262 |
| 6,977,569 B2 * | 12/2005 | Deligianni et al. | 335/78 |
| 2002/0167380 A1 | 11/2002 | Kang et al. | |
| 2002/0190267 A1 * | 12/2002 | Robertson | 257/130 |
| 2003/0042117 A1 * | 3/2003 | Ma | 200/181 |
| 2004/0104444 A1 | 6/2004 | Wachtmann et al. | |
| 2004/0238907 A1 * | 12/2004 | Pinkerton et al. | 257/419 |
| 2005/0040486 A1 * | 2/2005 | Song et al. | 257/414 |

FOREIGN PATENT DOCUMENTS

| | | |
|---|---|---|
| GB | 2384363 | 7/2003 |
| WO | WO 02/43089 | 5/2002 |
| WO | WO 03/085442 | 10/2003 |
| WO | WO 03/098732 | 11/2003 |

* cited by examiner

SYSTEMS AND METHODS FOR ELECTRICALLY COUPLING WIRES AND CONDUCTORS

CROSS REFERENCE

This application is related to the following United States Patent Applications which are filed on even date herewith and which are incorporated herein by reference:

Ser. No. 11/015,060 entitled SYSTEMS AND METHODS FOR RECTIFYING AND DETECTING SIGNALS;

Ser. No. 11/015,934 entitled SIGNAL CONDUCTION FOR DOPED SEMICONDUCTORS; and

Ser. No. 11/016,131 entitled METHODS AND SYSTEMS FOR ALIGNING AND COUPLING DEVICES.

BACKGROUND

Integrated circuits have dominated the electronics industry for many years. Some applications require the use of multiple integrated circuits in combination. Signals between these multiple integrated circuits are connected in order for them to perform their intended function.

Wire bonding is one method for connecting signals between integrated circuits. Each integrated circuit may include a wire bonding pad. An electrical interconnection between the integrated circuits is made by connecting a thin wire between the wire bonding pads. As the size of integrated circuits decreases, the space used for wire bonding techniques, such as for the bonding pads and the fan-out structures to bring signals to the bonding pads, becomes a larger proportion of entire integrated circuit surface.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some general concepts of the invention in a simplified form as a prelude to the more detailed description that is presented later.

In one embodiment, the invention encompasses a system having a first device and a second device. The first device has a surface and includes a micrometer-scale or smaller geometry first wire extending along its surface. The second device has a surface opposite the surface of the first device and includes a micrometer-scale or smaller second wire extending through the second device to a position in proximity to the surface of the second device. One of the first and second devices is displaceable between first and second positions relative to the other device. The first wire is not substantially electrically coupled to the second wire in the first position and the first wire is substantially electrically coupled to the second wire in the second position.

In another embodiment, the invention encompasses a method for substantially electrically coupling a micrometer-scale or smaller geometry first wire to a micrometer-scale or smaller geometry second wire. A first device has a surface and includes the first wire extending along its surface. A second device has a surface opposite the surface of the first device and includes the second wire extending through the second device to a position in proximity to the surface of the second device. The first and second devices are displaced relative each other device. A signal is received from a sensor, the signal indicating the relative position of first and second wires. The alignment of the first and second wires is determined in response to the signal.

In yet another embodiment, the invention encompasses a method of substantially electrically coupling a micrometer-scale or smaller geometry first wire to a micrometer-scale or smaller geometry second wire. A first device has a surface and includes the first wire extending along its surface. A second device has a surface opposite the surface of the first device and includes the second wire extending through the second device to a position in proximity to the surface of the second device. A signal is received identifying one of the first and second wires. Position information is read from memory corresponding to the wire identified. One of the first and second devices is displaced in response to the position information.

In another embodiment, the invention encompasses a system having a first device and a second device. The first device has a micrometer-scale or smaller geometry first conductor. The second device has a micrometer-scale or smaller geometry second conductor. An actuator displaces at least one of the first and second devices relative to the other device between first and second positions. Signals are substantially coupled between the first and second conductors in the first position and not in the second position.

In another embodiment, the invention encompasses a method of conducting signals between first and second devices. The first device has a micrometer-scale or smaller geometry first conductor and the second device has a micrometer-scale or smaller geometry second conductor. A command signal is received, the command signal indicating to align the first and second conductors. A control signal is generated in response to the command signal. At least one of the first and second devices is actuated in response to the control signal to align the first and second conductors.

BRIEF DESCRIPTION OF THE DRAWINGS

For the purpose of illustrating the invention, there is shown in the drawings a form that is presently preferred; it being understood, however, that this invention is not limited to the precise arrangements and instrumentalities shown.

DETAILED DESCRIPTION

Figure 1A:
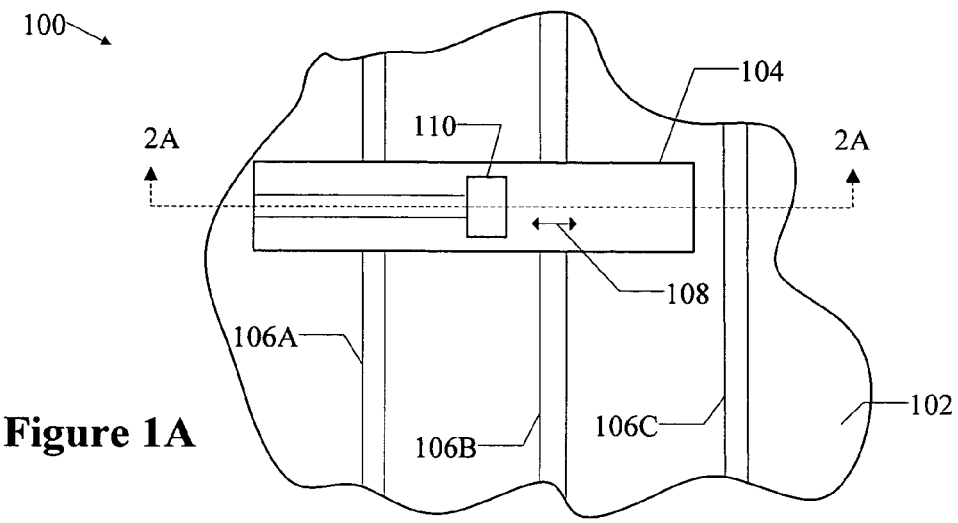
FIGS. 1A-C are top views of a portion of a system according to an embodiment of the invention in a first position, second position, and third position, respectively, according to an embodiment of the invention.
Figure 1B:
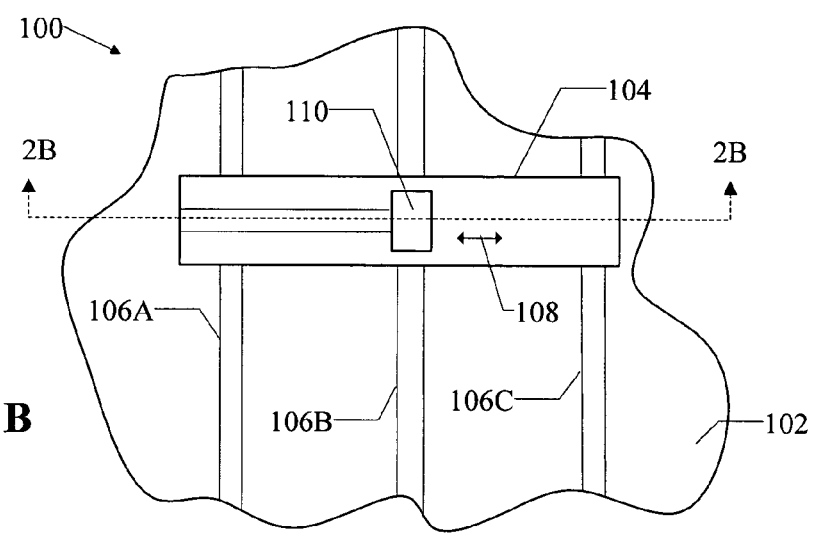
Figure 1C:
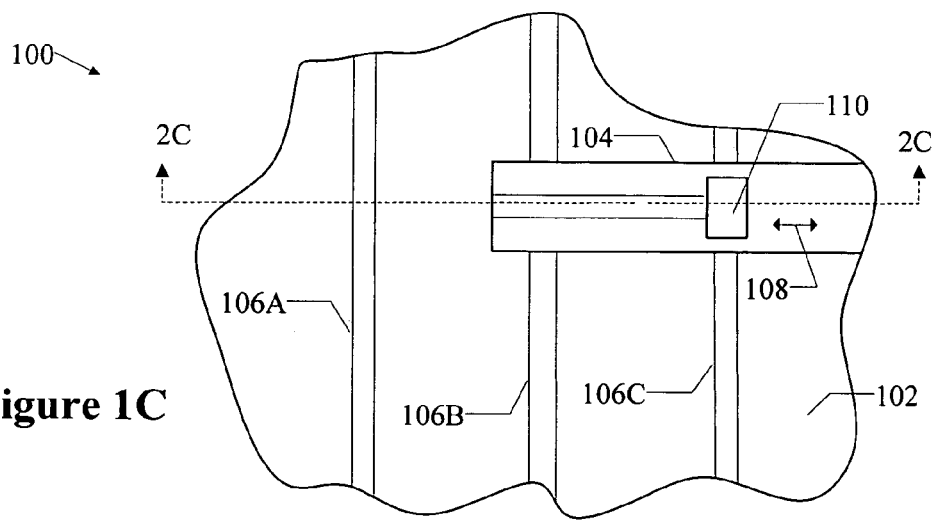

Referring to the drawings, in which like reference numerals indicate like elements, there is shown in FIGS. 1A-C top views of a system 100 according to an embodiment of the invention. The system 100 includes a first device 102 and a second device 104. Structures (e.g., electronic circuits, mechanical components) on or in the first and second devices 102, 104 are manufactured using micrometer-scale or smaller technology.

Figure 2A:
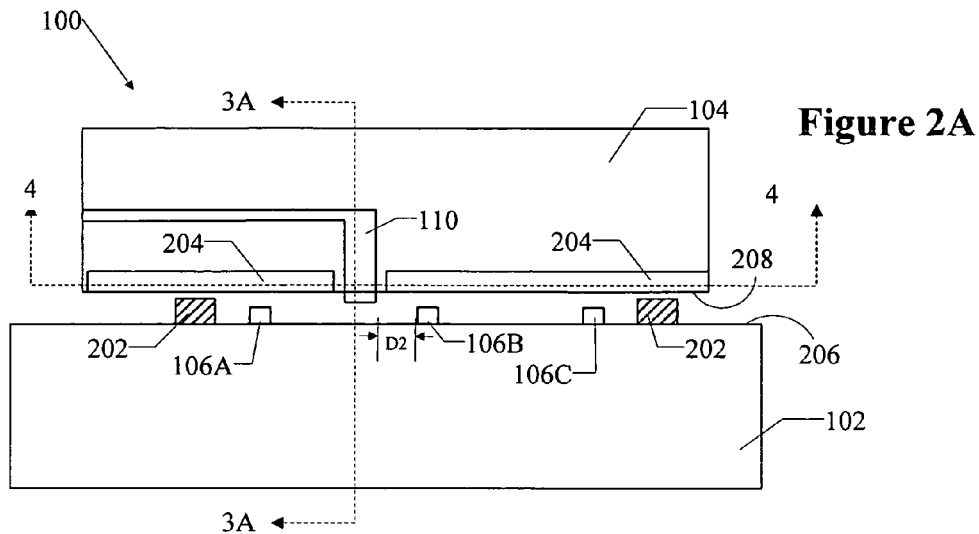
FIGS. 2A-C are cross-sectional views of the system shown in FIGS. 1A-C taken along lines 2A-2A, 2B-2B, and 2C-2C, respectively, according to an embodiment of the invention.
Figure 2B:
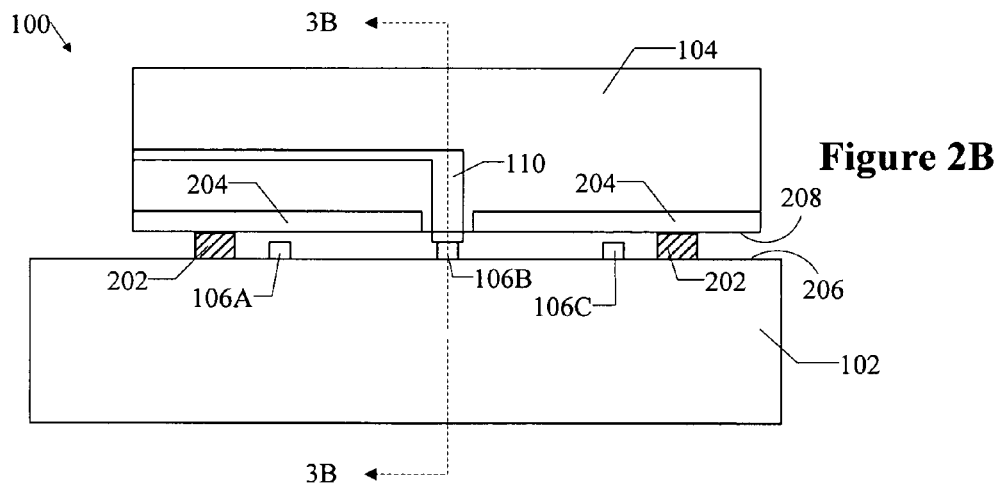
Figure 2C:
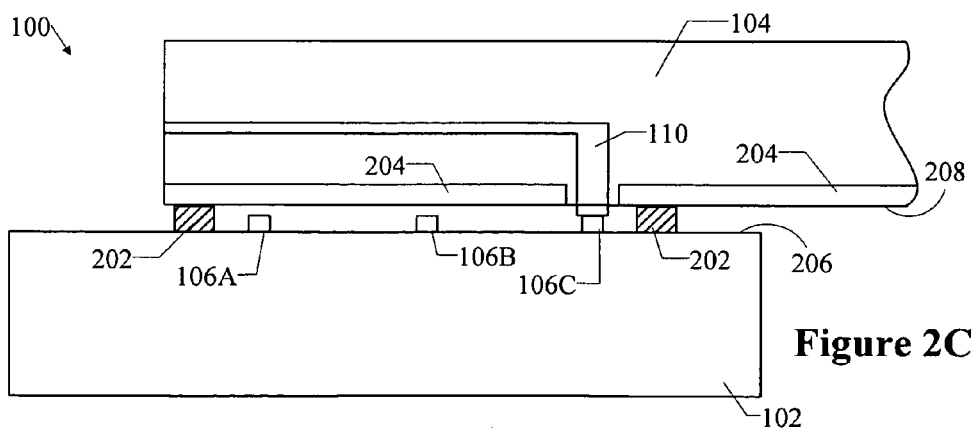
Figure 3A:
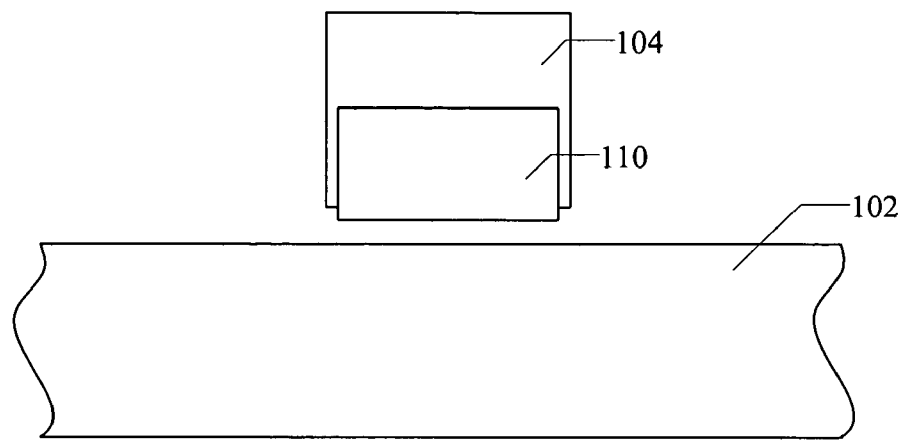
FIGS. 3A and 3B are a cross-sectional views of the system shown in FIGS. 2A and 2B, respectively, taken along line 3A-3A and line 3B-3B, respectively, according to an embodiment of the invention.
Figure 3B:
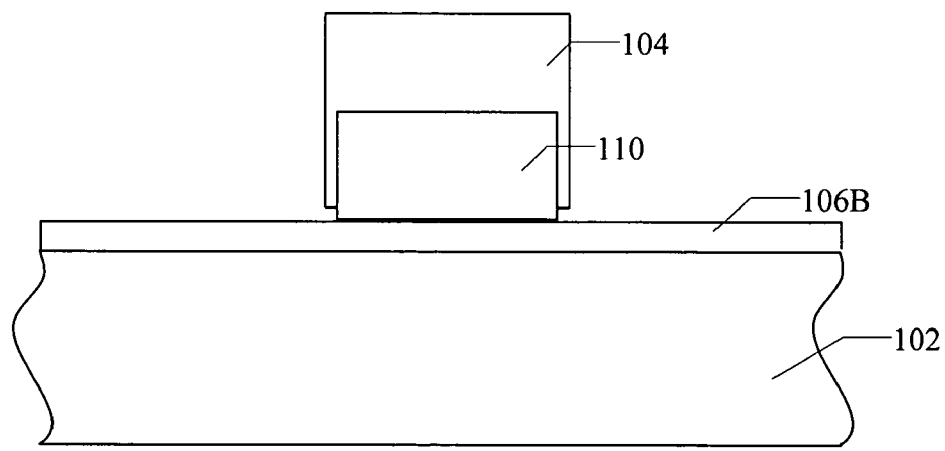
Figure 4:
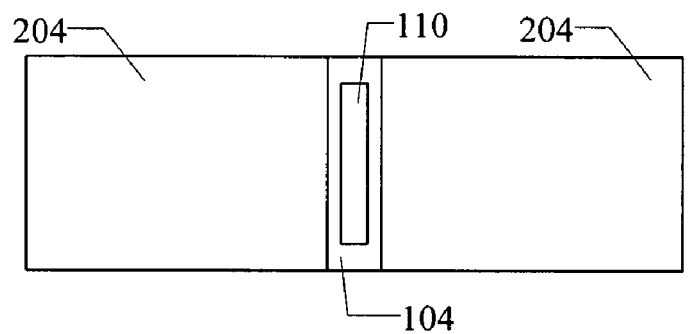
FIG. 4 is a cross-sectional view of the system shown in FIG. 2A taken along line 4-4 according to an embodiment of the invention.

The second device 104 is shown in a first position in FIG. 1A, in a second position in FIG. 1B, and in a third position in FIG. 1C, relative to the first device 102. FIGS. 2A-C are cross-sectional views of the system 100 taken along lines 2A-2A, 2B-2B and 2C-2C in FIGS. 1A-C, respectively. FIGS. 3A and 3B are cross-sectional views of the system 100 taken along lines 3A-3A, 3B-3B in FIGS. 2A and 2B, respectively. FIG. 4 is a cross-sectional view of the system 100 shown in FIG. 2A taken along line 4-4. The system 100 is described below with reference to FIGS. 1-4.

In an embodiment of the invention, the structures in or on the first and second devices 102, 104 include a plurality of wires 106 that extend along the surface 206 of the first device 102 and a wire 110 that extends through the second device 104 and through the surface 208 of the second device 104. The wires 106, 110 are formed on the devices 102, 104 at micrometer-scale or smaller geometries.

The second device 104 is displaceable between positions where the wire 110 in the second device 104 is substantially electrically coupled to one of the plurality of wires 106 in the first device 102, as in the second and third positions shown in FIGS. 1B and 1C, respectively, and positions where the wire 110 in the second device 104 is not substantially electrically coupled to any of the plurality of wires 106 in the first device 102, as in the first position shown in FIG. 1A. According to embodiments of the invention, a wire or conductor may be electrically coupled to another wire or conductor indirectly such as by inductive or capacitive coupling or by direct contact.

Embodiments of the invention encompass interconnecting structures manufactured using different types of manufacturing technologies. For example, the first and second devices 102, 104 may be manufactured using different manufacturing processes and using different materials. Embodiments of the invention encompass interconnecting structures manufactured using different micrometer or smaller scale geometry processes. In an embodiment of the invention, the structures on the first device 102 and the structures on the second device 104 are manufactured using different micrometer or smaller scale geometry processes. In an embodiment of the invention, the wires 106 on the first device 102 are nanometer-scale structures and the wire 110 on the second device 104 is a micrometer scale structure.

The second device 104 is displaceable in a direction indicated by arrow 108. Although the arrow 108 indicates a substantially linear direction, embodiments of the invention encompass non-linear displacement of the devices 102, 104. Although the device 104 is shown as being displaceable in a direction perpendicular to the direction of the wires 106 on the first device 102, embodiments of the invention encompass a wire on one device being displaceable in a direction that is not perpendicular to wires on another device and the wires 106 are not necessarily parallel.

The first device 102 has a surface 206 and the second device 104 has a surface 208 substantially opposite the surface 206 of the first device 102. A plurality of wires 106 each extend along the surface 206 of the first device 102. The term "along the surface" encompasses embodiments where the wires 106 are within the device, are flush or substantially flush with the surface 206 of the device, and extend past the surface 206 of the first device 102 (embodiments of the invention illustrating different positions of wires along the surface of a device are later described with reference to FIGS. 5A-D).

In the first position of the second device 104 as shown in FIG. 1A, the wire 110 in the second device 104 is a distance D2 (see FIG. 2A) sufficiently away from all of the plurality of wires 106 in the first device 102 so that it is not electrically coupled to one of the plurality of wires 106. In the embodiment of the invention shown in FIG. 2A, the system 100 includes a ground plane 204. The ground plane 204 facilitates electrically isolating the wire 110 in the second device 104 from the wires 106 along the surface 206 of the first device 102 when in the first position.

The wire 110 in the second device 104 extends through the surface of the device and through an opening in the ground plane 204 as illustrated in FIGS. 2A and 4. When the wire 110 in the first device 104 is positioned away from the wires 106 in the first device 102, the wires 106 in the first device 102 are in proximity to the ground plane 204. The ground plane may inhibit signals in the wire 110 in the second device 104 from being coupled to wires 106 in the first device 102 when wire 110 is away from the wires 106 in the first device 102. Although the term "ground" plane is used herein, embodiments of the invention encompass applying a direct current (DC) voltage to the conductive plane 204.

In the second position of the second device 104 as shown in FIG. 1B, the wire 110 in the second device 104 is sufficiently close to and in proximity to one of the plurality of wires 106B in the first device 102 so that signals may be electrically coupled between the wire 110 on the second device 104 and the wire 106B on the first device 102. Similarly, in the third position of the second device 104 shown in FIG. 1C, the wire 110 in the second device 104 is positioned in proximity to one of the plurality of wires 106C in the first device 102 so that it is electrically coupled to that wire 106C.

A system according to an embodiment of the invention may include a clamping or other mechanism to apply a force to bring the first and second devices 102, 104 toward each other. This force may be applied when the wire 110 in the second device 104 is in proximity to one of the wires 106 in the first device 102 to enhance the electrical coupling between the wires 110, 106 by bringing them closer together.

Figure 9A:
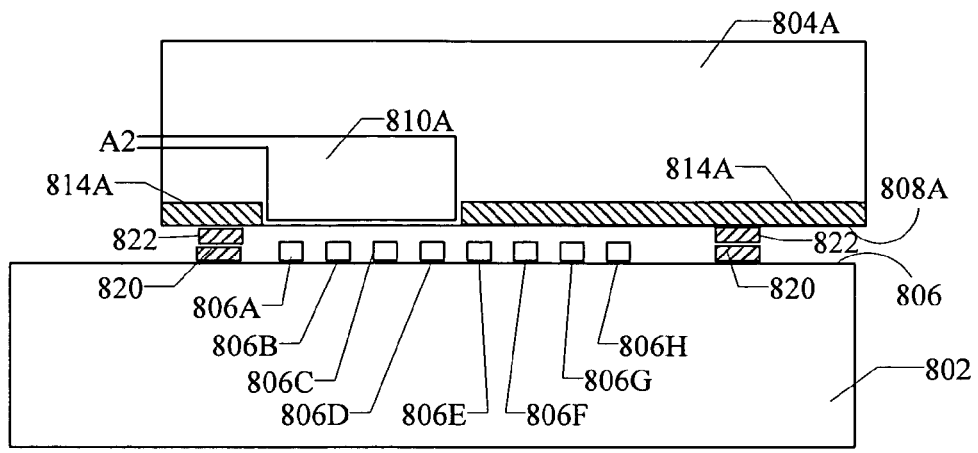
FIGS. 9A-C illustrate cross-sectional views of the system shown in FIG. 8 along lines 9A-9A, 9B-9B and 9C-9C, respectively, according to an embodiment of the invention.
Figure 9B:
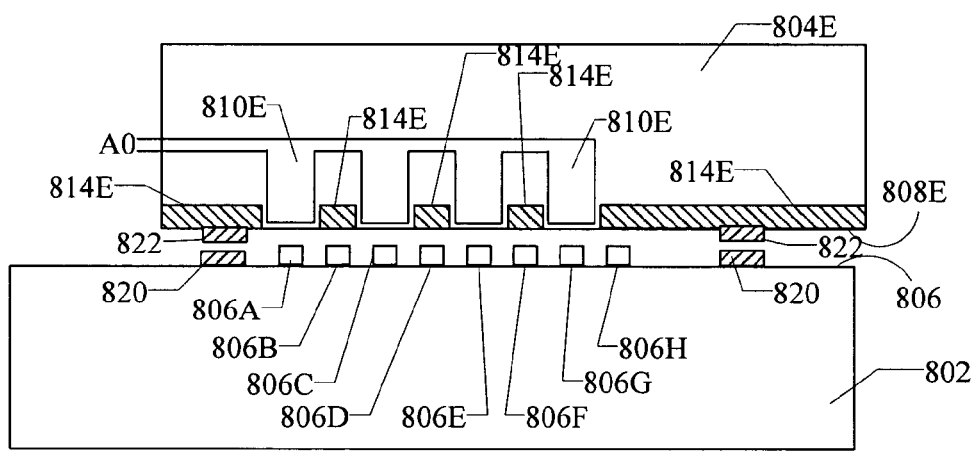

The system 100 shown in FIGS. 2A-C includes a clamping mechanism that applies an electrostatic force to pull the first and second devices 102, 104 together. The clamping mechanism shown in FIG. 2B includes electrostatic clamping electrodes 202. A charge or potential may be applied to the electrodes 202 and an opposite charge or potential may be applied to the ground plane 204 to pull the two devices 102, 104 together. In another embodiment, the second device 104 also includes clamping electrodes (as shown in FIGS. 9A and 9B) that are oppositely charged and attracted to the clamping electrodes 202 on the first device 102. Embodiments of the invention encompass electrostatic actuators for attracting devices together where an attractive force is generated by applying a potential difference between the electrodes such as positive and negative, positive and ground, negative and ground, or different levels of positive and positive or negative and negative potentials.

The wires 106 on the first device 102 and the wire 110 on the second device 104 shown in FIGS. 1-3 extend beyond the surface 206, 208 of their respective devices 102, 104 by a distance such that the wires 106, 110 connect to each other in the second and third positions as shown in FIGS. 2B and 2C, respectively. When the wires 106, 110 are connected to each other, signals may be directly communicated between the wires 106, 110. As described below with reference to FIGS. 5A-D, the wires 106, 110, ground (or conductive) plane 204, and electrodes 202 may be positioned within, at the surface of, or above the surface of their respective devices according to embodiments of the invention.

Figure 5A:
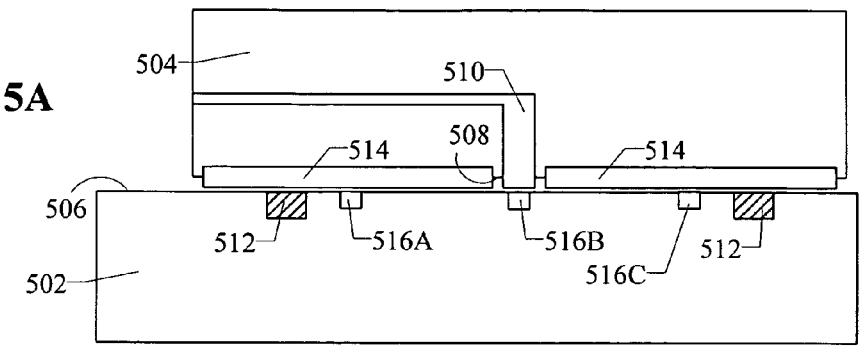
FIGS. 5A-D are cross-sectional views illustrating various positions of wires relative to devices according to embodiments of the invention.

In FIG. 5A there is shown a plurality of wires 516 and electrodes 512 that are substantially flush with the surface 506 of the first device 502. The ground plane 514 and wire 510 extend past the surface 508 of the first device 504. When the first and second devices 502, 504 are brought together, the wire 510 of the second device 504 contacts the wire 516B of the first device 502 and signals may be directly communicated or conducted between the wires 510, 516B.

Figure 5B:
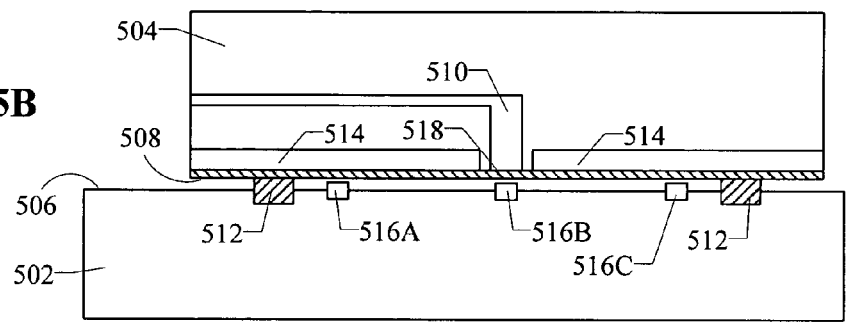

In FIG. 5B there is shown a plurality of wires 516 and electrodes 512 that extend past or through the surface 506 of the first device 502. The conductive plane 514 and wire 510 extend to a position in proximity to but not at the surface 508 of the first device 504. When the first and second devices 504 are pulled together, the wire 510 of the second device 504 does not contact the wire 516B of the first device 502. The wires 510, 516B are separated by a dielectric material 518. Although the wires 510, 516B in the first and second devices 102, 104 do not contact each other in FIG. 5B, signals from one wire 510, 516B may still be coupled to the other wire. When the devices 502, 504 are brought together, alternating current (AC) signals may be coupled between the wires 510, 516B such as by capacitive or inductive coupling, for example.

Figure 5C:
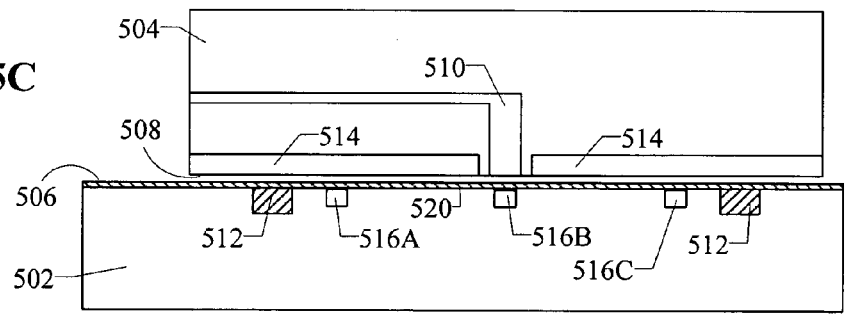

In FIG. 5C there is shown a plurality of wires 516 and electrodes 512 that extend to a position in proximity to but not at the surface 506 of the first device 502. The ground plane 514 and wire 510 extend to a position substantially flush with the surface 508 of the first device 504. When the first and second devices 504 are pulled together, the wire 510 of the second device 504 does not contact the wire 516B of the first device 502 because the wire 516B is not at the surface of the first device 502. The wires 510, 516B are separated by a dielectric material 520. Although the wires 510, 516B are not connected in FIG. 5C, they are capacitively coupled when the devices 502, 504 are brought together as in FIG. 5B and AC signals may be communicated between the wires 510, 516B.

Figure 5D:
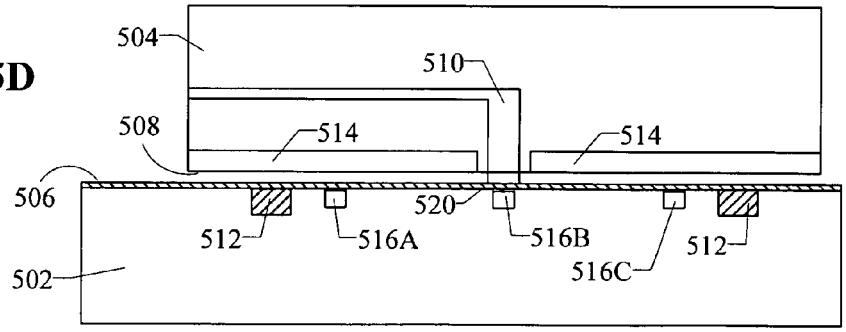

In FIG. 5D there is shown an embodiment of the invention similar to that in FIG. 5C but with the wire 510 extending to a position past the surface 508 of the first device 504. The wires 510, 516B in FIG. 5D are not connected and are capacitively coupled when the devices 502, 504 are brought together with a dielectric material 520 separating the wires 510, 516B.

Figure 6A:
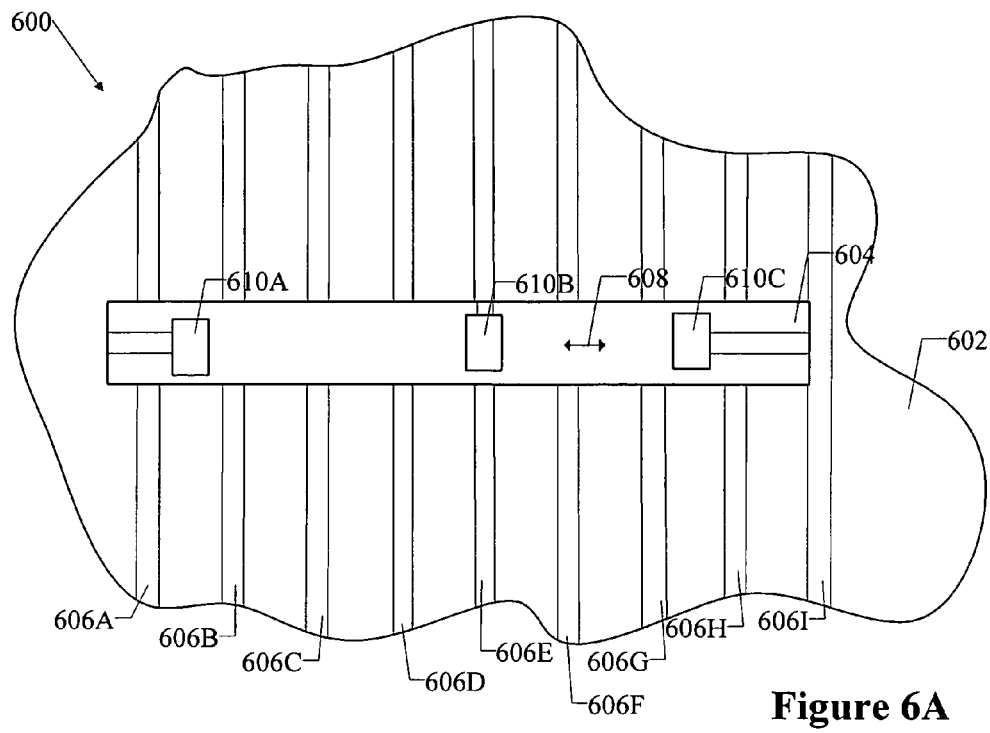
FIGS. 6A and 6B are top views of a system including multiple wires in a device according to an embodiment of the invention.
Figure 6B:
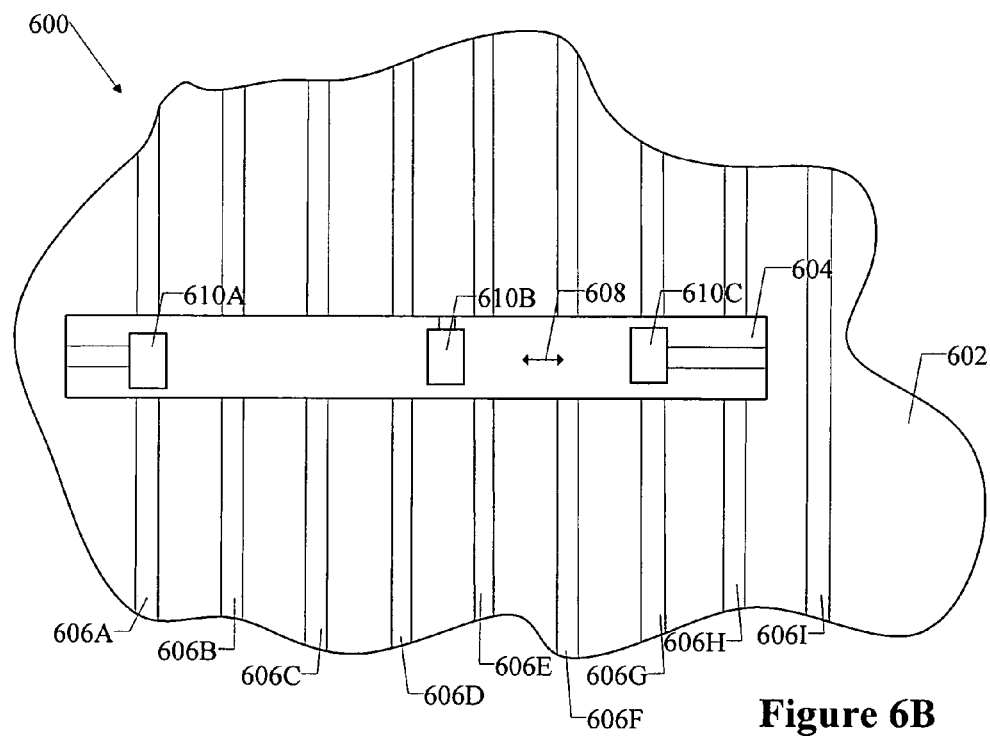

There is shown in FIGS. 6A and 6B top views of a system 600 according to an embodiment of the invention. The system 600 includes a first device 602 and a second device 604. The second device 604 is displaceable in a direction indicated by arrow 608. The second device 604 is shown in a first position in FIG. 6A and in a second position in FIG. 6B, relative to the first device 602.

A plurality of wires 606 each extend along the surface of the first device 602. A plurality of wires 610 extend through the second device 604 and through the surface of the second device 604. With multiple wires 610 in the second device 604, each position of the second device 604 allows multiple wires 610 from the second device 604 to be electrically coupled to or electrically de-coupled from the wires 606 in the first device 602. In addition, multiple wires 610 allow the second device 604 to move a shorter distance and still electrically couple one of the wires 610 to any one of the wires 606 of the first device 602.

In the first position shown in FIG. 6A, two of the wires 610A, 610C of the second device 604 are not electrically coupled to the wires 606 in the first device 602 and another wire 610B is electrically coupled to a wire 606E in the first device 602. In the second position shown in FIG. 6B, the wires 610A, 610C of the second device 604 are electrically coupled to several of the wires 606A, 606G in the first device 602 and the wire 610B is not electrically coupled to a wire 606 in the first device 602. Although the wires 610 of the second device 602 are shown as independent and not connected to each other in the embodiment shown in FIGS. 6A and 6B, the wires 610 can be connected together according to another embodiment of the invention.

Figure 7A:
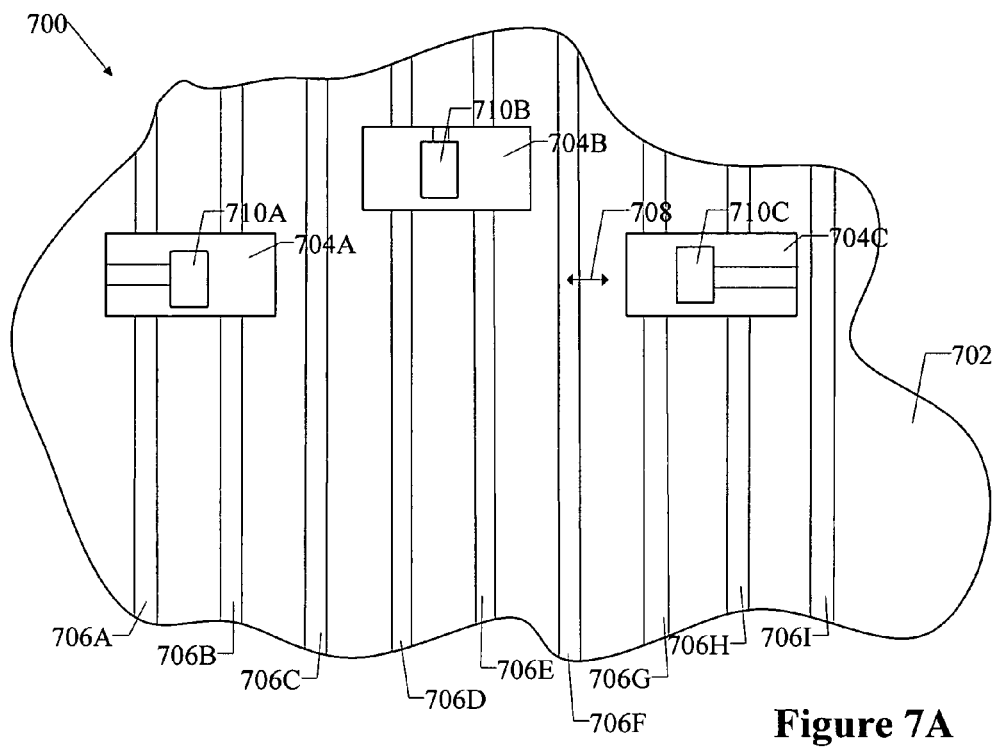
FIGS. 7A and 7B are top views of a system including multiple devices according to an embodiment of the invention.
Figure 7B:
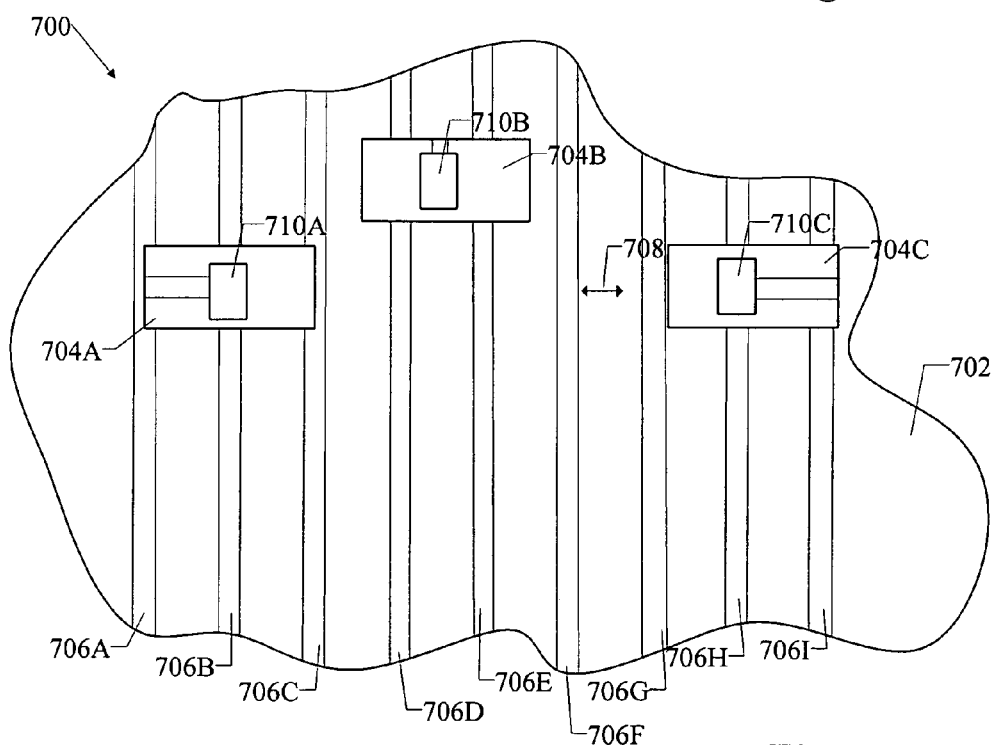

There is shown in FIGS. 7A and 7B top views of a system 700 according to an embodiment of the invention. The system 700 includes a first device 702, a second device 704A, a third device 704B, and a fourth device 704C. The second, third, and fourth devices 704 are displaceable in a direction indicated by arrow 708, relative to the first device 702. The second, third, and fourth devices 704 are each shown in a respective first position in FIG. 7A and in a respective second position in FIG. 7B, relative to the first device 702. Each of the second, third, and fourth devices 704A-C may be positioned independently to electrically couple or de-couple its respective wire 710A-C from a wire 706A-I of the first device 702.

With multiple devices each having a wire 710 as illustrated in FIGS. 7A and 7B, a wire 710 may be electrically coupled to a wire on the first device 702 with less displacement than with a single device with a wire 710. For example, in FIG. 7B the wire 706H is electrically coupled to the wire 710C on the fourth device 704C. From its first position in FIG. 7A, the fourth device 704C was actuated a distance less than the distance between two wires 706G and 706H. In comparison, with only the second device 704A (and not the third and fourth devices 704B, 704C), the second device 704A would be actuated more than the distance between six wires from 706B to 706H to couple to wire 706H. The shorter displacement distances allow for quicker transitions to connect to a particular wire 706 on the first substrate 702.

Although embodiments of the invention are described above with reference to alignment of wires on devices, embodiments of the invention also encompass devices with other forms of micrometer-scale or smaller signal conductors. Signal conductors encompass materials that convey signals including transmitters and receivers of signals, including but not limited to sound and electromagnetic signals. In an embodiment of the invention, the structures on the devices to be aligned conduct optical signals. For example, an optical transmitter on one device may be selectively aligned with one of a plurality of optical receivers on another device according to an embodiment of the invention.

Figure 8:
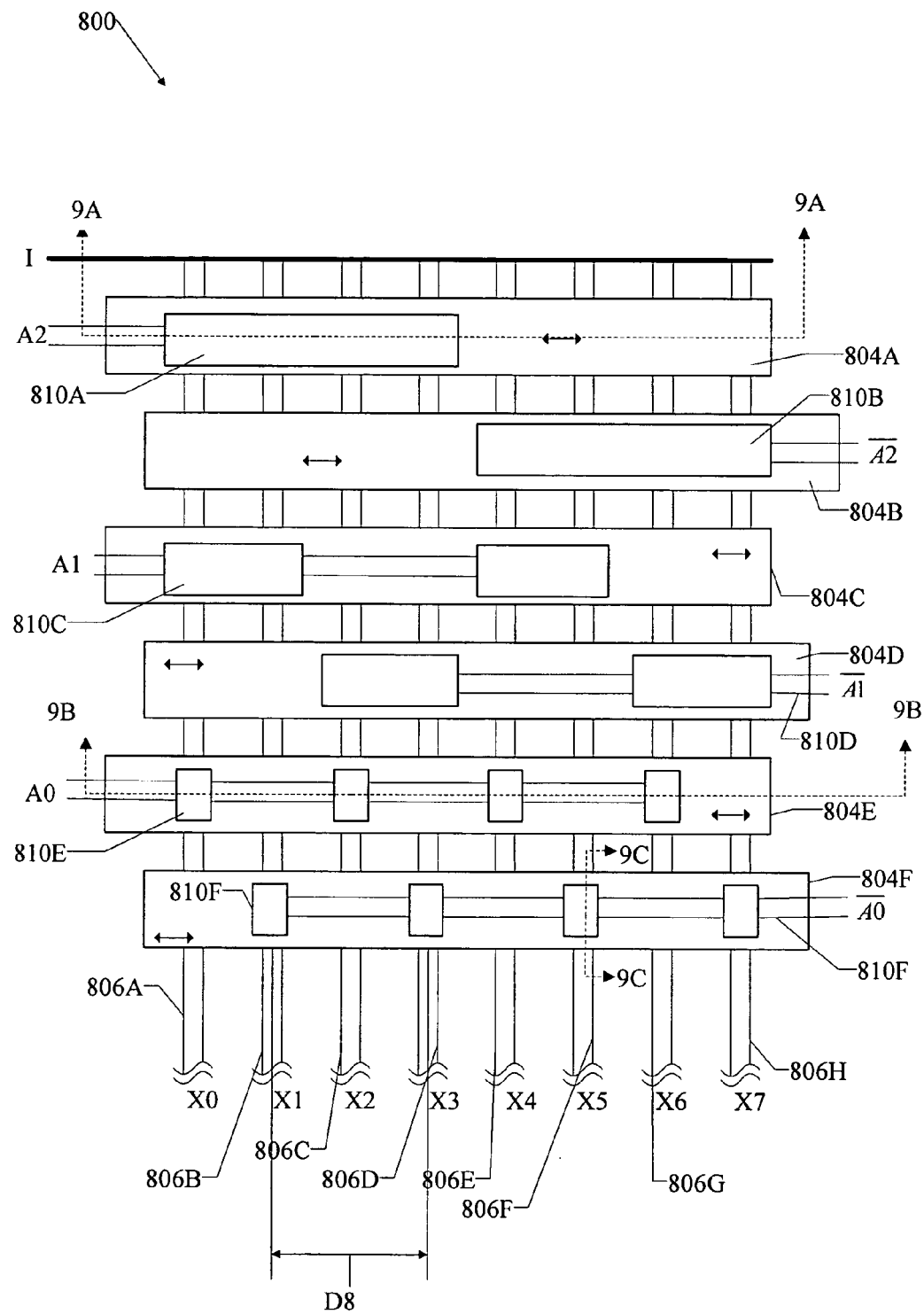
FIG. 8 is a top view of a system including multiple doped semiconductor regions and multiple wire devices according to an embodiment of the invention.

Although described above with reference to coupling signals from a wire on one device to a wire on another device, embodiments of the invention encompass coupling a wire on one device to a structure on another device for affecting the conductivity of the structure. There is shown in FIG. 8 a system 800 including a plurality of doped depletion-type semiconductor regions 806A-H according to an embodiment of the invention. A plurality of wire devices 804A-F each include at least one wire 810. The wires 810A-F extend through their respective wire devices 804A-F to at least one position in proximity to (e.g., within the wire device, substantially flush with the surface of the wire device, through the surface of the respective wire device) the surface of the respective wire device. Each wire 810A-F may span and may be coupled to one or more of the doped semiconductor regions 806A-H.

The wire 810A in wire device 804A extends through the wire device 804A to a position in proximity to four doped semiconductor regions 806A-D as illustrated in FIGS. 8 and 9A. FIG. 9A is a cross-sectional diagram of the system 800 shown in FIG. 8 taken along line 9A-9A. The wire 810A extends through the wire device 804A to a position in proximity to the surface 808A of the wire device 804A, opposite the surface 806 of the device 802. The clamping electrodes 820, 822 may be attracted to each other by applying opposite or different potentials to them to apply a force to pull the two devices 804A, 802 together. When a negative voltage is applied to the wire 810A, the four doped (e.g., depletion doped) semiconductor regions 806A-D become substantially non-conductive. The ground plane 814A of device 804A reduces the affect of the wire 810A on the four doped semiconductor regions 806E-H so their conductivity is not substantially affected by wire 810A.

The wire 810E in wire device 804E extends through the wire device 804E to a position in proximity to four doped semiconductor regions 806A, 806C, 806E, and 806G as illustrated in FIG. 9B. FIG. 9B is a cross-sectional diagram of the system 800 shown in FIG. 8 taken along line 9B-9B. The wire 810E extends through the wire device 804A to multiple positions in proximity to the surface 808E of the wire device 804E, opposite the surface 806 of the device 802. The clamping electrodes 820, 822 may apply a force to pull the two devices 804E, 806 together. When a negative voltage is applied to the wire 810E, the four doped (e.g., depletion doped) semiconductor regions 806A, 806C, 806E, and 806G become substantially non-conductive. The ground plane 814E of device 804E reduces the affect of the wire 810A on the four doped semiconductor regions 806E-H so their conductivity is not substantially affected by wire 810E.

The system 800 of FIG. 8 may be used as for binary-tree addressing according to an embodiment of the invention. Each wire 810 is driven by one of three control lines A0, A1, or A2 or by its inverse $\overline{A0}$, $\overline{A1}$, or $\overline{A2}$. With a zero or positive voltage (V≧0) applied to a wire 810, the depletion-type semiconductor regions that are proximate to that wire 810 are substantially conductive. With a negative voltage (V<0) applied to a wire 810, the depletion-type semiconductor regions proximate to the wire 810 are substantially non-conductive. The depletion-type semiconductor region becomes less conductive the greater the negative potential applied to the wire 810. The output signals corresponding to each doped semiconductor region 806A-H are designated X0-7, respectively in FIG. 8. Table 1 below shows the output signals X0-7 for combinations of the control signals A0-2 where an output signal having a value of "I" indicates that the respective doped semiconductor region is conductive and the input signal I is transmitted to the corresponding output X0-7. Although shown as having a common input I, embodiments of the invention encompass some and all of the doped semiconductor region 806A-H having a separate input signal.

TABLE 1

| Control | | | | | | Output Signals | | | | | | | |
|---|---|---|---|---|---|---|---|---|---|---|---|---|---|
| $A_2$ | $\overline{A_2}$ | $A_1$ | $\overline{A_1}$ | $A_0$ | $\overline{A_0}$ | X0 | X1 | X2 | X3 | X4 | X5 | X6 | X7 |
| 0 | −V | 0 | −V | 0 | −V | I | 0 | 0 | 0 | 0 | 0 | 0 | 0 |
| 0 | −V | 0 | −V | −V | 0 | 0 | I | 0 | 0 | 0 | 0 | 0 | 0 |
| 0 | −V | −V | 0 | 0 | −V | 0 | 0 | I | 0 | 0 | 0 | 0 | 0 |
| 0 | −V | −V | 0 | −V | 0 | 0 | 0 | 0 | I | 0 | 0 | 0 | 0 |
| −V | 0 | 0 | −V | 0 | −V | 0 | 0 | 0 | 0 | I | 0 | 0 | 0 |
| −V | 0 | 0 | −V | −V | 0 | 0 | 0 | 0 | 0 | 0 | I | 0 | 0 |
| −V | 0 | −V | 0 | 0 | −V | 0 | 0 | 0 | 0 | 0 | 0 | I | 0 |
| −V | 0 | −V | 0 | −V | 0 | 0 | 0 | 0 | 0 | 0 | 0 | 0 | I |

Embodiments of the invention are not limited to a particular semiconductor material or doping thereof. In an embodiment of the invention, the structure (e.g., 806A-H) is an enhancement-type semiconductor region. A voltage applied to a wire (e.g., 810) on another device affects the conductivity of the enhancement-type semiconductor region. With a zero or positive voltage (V≧0) applied to a wire (e.g., 810) the enhancement-type semiconductor regions that are proximate to that wire (e.g., 810) are substantially non-conductive. With a negative voltage (V<0) applied to a wire (e.g., 810), the enhancement-type semiconductor regions proximate to the wire (e.g., 810) are substantially conductive. The enhancement-type semiconductor region becomes more conductive the greater the negative potential applied to the wire 810. In an embodiment of the invention, the voltage V is measured with reference to the potential of the corresponding structure 806 (e.g., voltage V is measured between wire 810F and doped semiconductor region 806F).

Figure 9C:
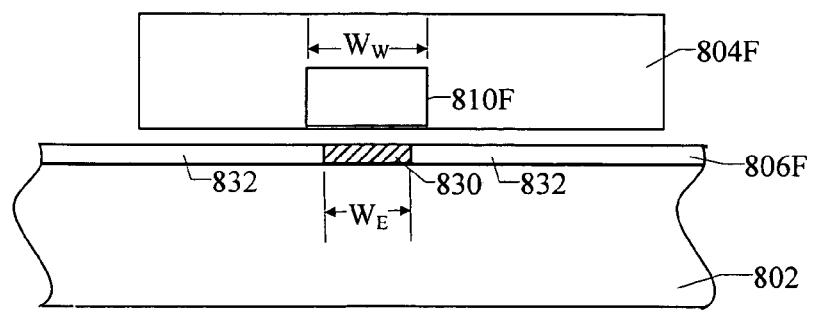

FIG. 9C is a cross-sectional diagram of the system 800 shown in FIG. 8 taken along line 9C-9C in an embodiment where the structures 806 are enhancement-type semiconductor regions. The structure 806F includes a portion 830 comprising an enhancement-type semiconductor and a portion 832 that is conductive. The wire 810F of the wire device 804F has a width $W_W$ larger than the width $W_E$ of the enhancement-type semiconductor portion in the embodiment shown in FIG. 9C. The larger width $W_W$ of the wire 810F encompasses the enhancement-type semiconductor portion 830 so all of the enhancement-type semiconductor portion 830 becomes substantially conductive when a negative voltage (V<0) is applied to the wire 810F.

Figure 10:
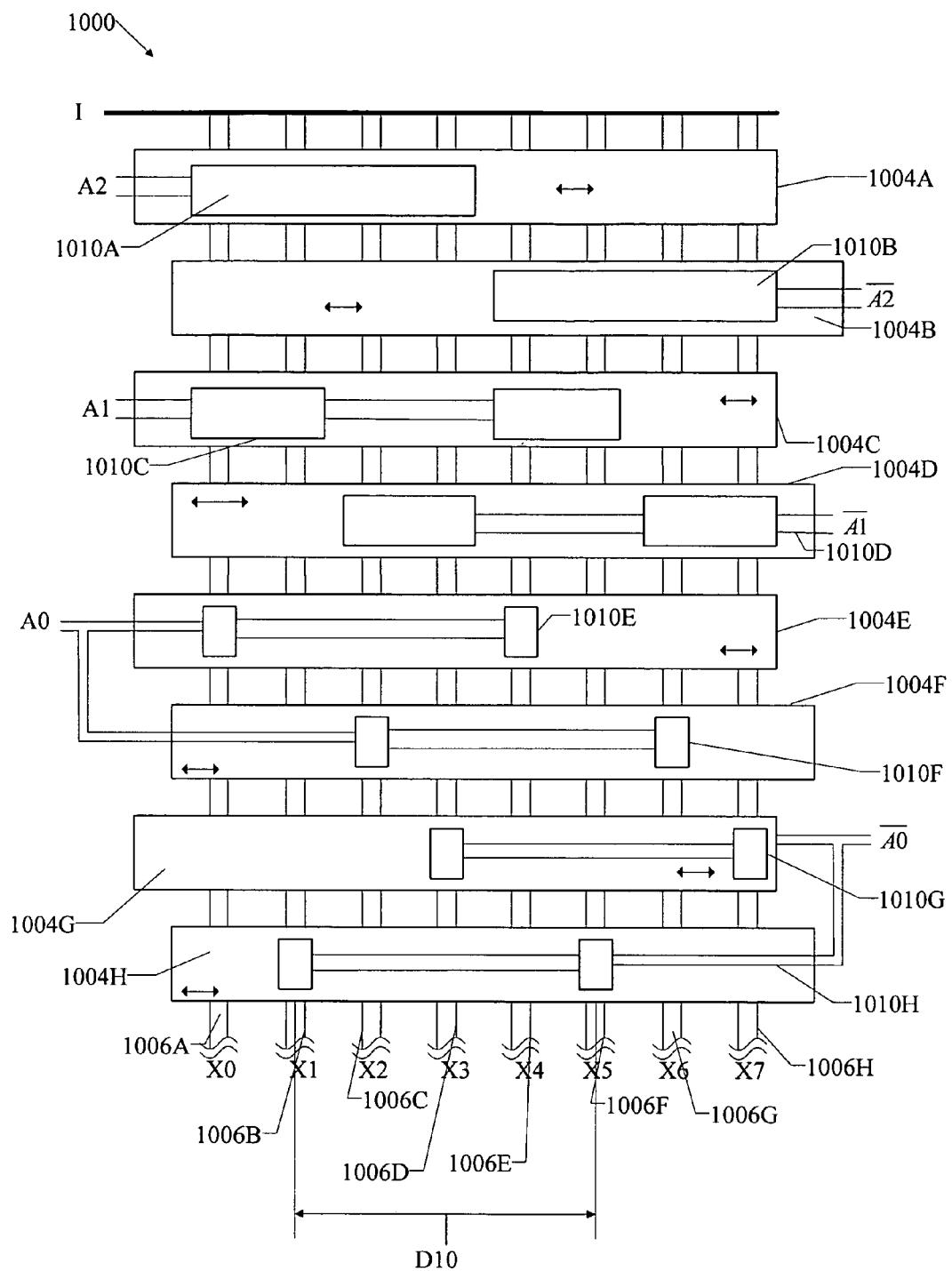
FIG. 10 is a top view of a system including multiple doped semiconductor regions and multiple wire devices according to an embodiment of the invention.

There is shown in FIG. 10 a system 1000 including a plurality of doped depletion-type semiconductor regions 1006A-H according to an embodiment of the invention. A plurality of wire devices 1004A-H include at least one wire

1010. The wires 1010A-H extend through their respective wire devices 1004A-H to at least one position in proximity to (e.g., within the wire device, substantially flush with the surface of the wire device, through the surface of the respective wire device) the surface of the respective wire device. The wires 1010A-H may span and may be coupled to one or more of the doped semiconductor regions 1006A-H.

The function of the system 1000 in FIG. 10 is similar to the system 800 shown in FIG. 8, but its structure differs. The output signals X0-7 for the system 1000 in FIG. 10 are shown in Table 1 above for combinations of the control signals A0-2 where an output signal having a value of "l" indicates that the respective doped semiconductor region is conductive and the input signal I is transmitted to the corresponding output X0-7. However, the system 1000 includes two additional wire devices 1004G and 1004H as compared to the system 800 in FIG. 8. Four wire devices 1004E-H are driven by the control signal A0 (and $\overline{A0}$) rather than two devices as in system 800. Additional wire devices are used to increase the distance D10 shown in FIG. 10, which is greater than the distance D8 shown in FIG. 8, between positions where the wires 1010 in the wire devices 1004 extend through the wire device 1004 to positions in proximity to their respective surfaces.

Some manufacturing methods become more complex as structures are positioned close to each other. For example, it may be more difficult to manufacture structures using photolithography if the structures have sub-wavelength features due to fringing caused by diffraction patterns. In the system 800 shown in FIG. 8, the wires 810E and 810F include structures extending to positions in proximity to the surface which are a distance D8 apart. In the system 1000, the function of wires 810E-F in FIG. 8 are performed by wire devices 1004E-H and wires 1010E-H. The number of wires and wire structures is increased compared to the system 800 shown in FIG. 8. However, the distance D10 in FIG. 10 between structures formed in the wire devices 1004E-H is greater than the distance D8 in FIG. 8 between structures formed in the wire devices 804E-F, thus reducing manufacturing complexity and/or allowing the regions 1006 to be positioned closer together than would be possible under the system 800 shown in FIG. 8.

The wire devices 804, 1004 in FIGS. 8 and 10 are only shown in a single position such that their respective wires 810, 1010 are in alignment with selected structures 806, 1006 on the first devices 802, 1002. Embodiments of the invention encompass actuating the wire devices 804, 1004 as illustrated by the arrows in FIGS. 8 and 10 to align their respective wires 810, 1010 with selected structures 806, 1006 on the first devices 802, 1002. In an embodiment of the invention, the wire devices are actuated to positions where their respective wires 810, 1010 are aligned with selected structures 806, 1006 on the first devices 802, 1002 and the first and second devices 802, 1002, 804, 1004 are bonded together in aligned positions.

Figure 11:
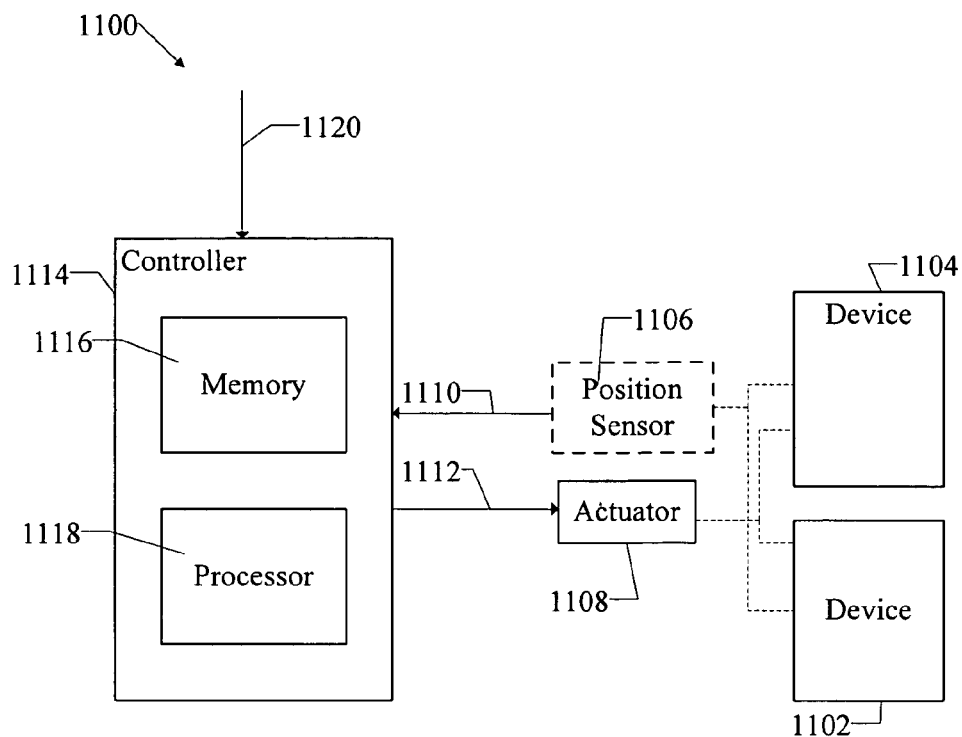
FIG. 11 is a block diagram of a system according to an embodiment of the invention.

There is shown in FIG. 11 a block diagram of a system 1100 according to an embodiment of the invention including a first device 1102 and a second device 1104. Each device 1102, 1104 includes one or more wires or other structures (not shown) such as described with reference to the first and second devices of FIGS. 1-10. A controller 1114 receives a command signal 1120 indicating to align (or misalign) structures on the first and second devices. In response to the command signal 1120, the controller 1114 controls an actuator 1108 to displace one or both of the devices 1102, 1104 to align (or misalign) the structures on the devices 1102, 1104 in response to position information received from a position sensor 1106. In an embodiment of the invention, the command signal 1120 may be generated by a processor (not shown) that controls the alignment or misalignment of structures on the first and second devices. The controller 1114 includes a processor 1118 that receives and processes the position information from the sensor 1106 to generate a control signal 1112 transmitted to the actuator 1108 to control the actuator 1108 to displace one or both of the devices 1102, 1104 in response to the position information received from the position sensor 1106 and the command signal 1120. Although the controller 1114, position sensor 1106, and actuator 1108 are illustrated as being separate from the devices 1102, 1104, embodiments encompass one or more of the controller 1114, position sensor 1106, and actuator 1108 being formed on one or both of the devices 1102, 1104.

In an embodiment of the invention, the position sensor 1106 indicates relative position of the first and second devices based on the coupling of a signal (e.g., via direct contact or via capacitive coupling) from a wire on one device to a wire on the other device. The level of coupling may be detected with a current sensor, for example, by grounding the wires in the first device, coupling the wire in the second device to a signal source (e.g., a voltage source), and sensing the current through one of the wires. As the wire in the first device passes a wire in the second device, a peak in current will be detected, indicating alignment of the wires. Similarly, the low points in the current may be detected to identify positions where the wires are not aligned and positions where the wires are decoupled. The alignment of a wire with a region such as in FIGS. 8-10 may also be sensed by measuring the current flow (or lack thereof) through a region 806, 1006 as the devices are actuated relative to each other.

The sensor 1106 is shown as connected to the first and second devices 1102, 1104 in phantom because embodiments of the invention encompass the position sensor detecting position based on information from the first device 1102, the second device 1104, or from both the first and second devices 1102, 1104. In the embodiment described above, the current sensor may be coupled to wires on either the first or second devices 1102, 1104 to detect the level of coupling between wires on the first and second devices 1102, 1104.

Figure 12A:
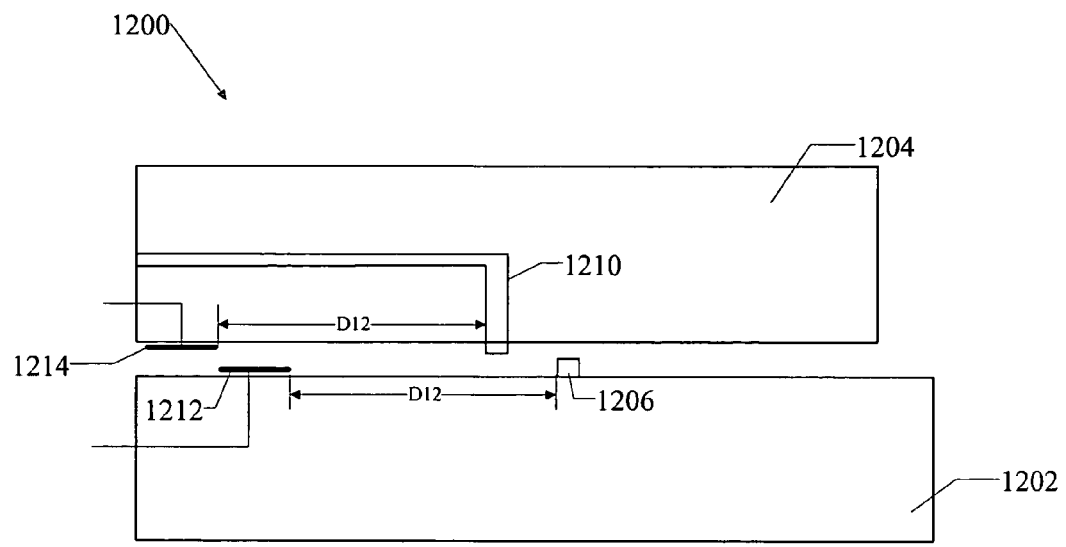
FIGS. 12A and 12B are cross-sectional diagrams of a system according to an embodiment of the invention.
Figure 12B:
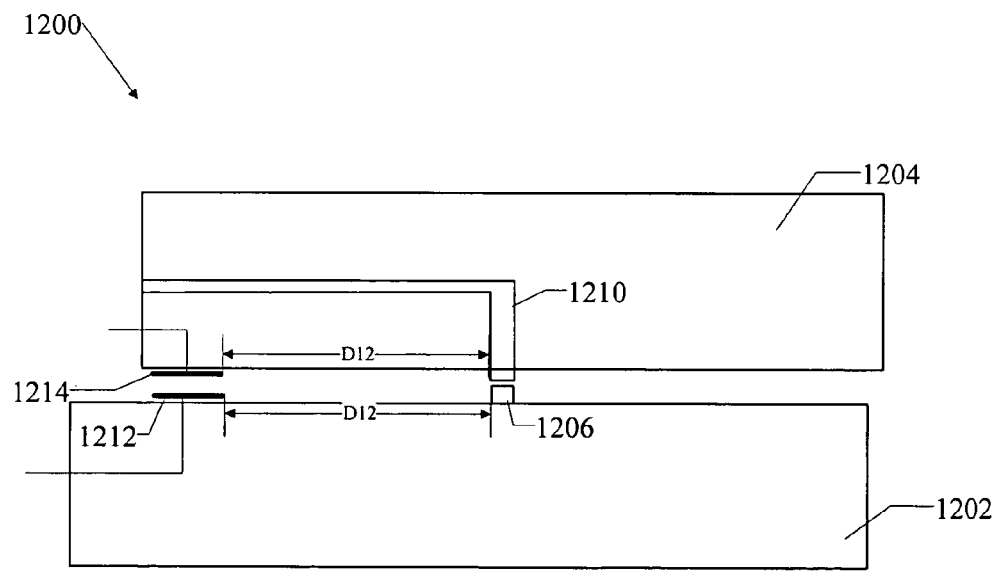

Embodiments of the invention encompass sensing alignment or misalignment of wires on the first and second devices 1102, 1104 without sensing coupling of signals between the wires on the different devices 1102, 1104. For example, according to an embodiment of the invention, a system 1200 as shown in FIGS. 12A-B uses capacitive coupling between structures other than the wires on the devices 1202, 1204 to determine their alignment. The system 1200 includes a first device 1202 an a second device 1204. The first device includes a wire 1206 and the second device 1204 includes a wire 1210. The first and second plates 1212, 1214, connected to the first and second devices 1202, 1204, respectively, are used to determine the level of alignment between the wires 1206, 1210.

The first and second plates 1212, 1214 are coupled to a position sensor 1106 (not shown in FIG. 12) that determines the capacitive coupling between the plates 1212, 1214. The capacitance is at a peak when the plates 1212, 1214 are aligned and decreases as the plates 1212, 1214 move further apart. As illustrated in FIGS. 12A and 12B, the plates 1212, 1214 are each substantially the same distance D12 apart from respective wires 1206, 1210. Therefore, alignment of the plates 1212, 1214 results in alignment of the wires 1206, 1210. When the wire 1210 is not aligned with the wire 1206 as shown in FIG. 12A, the capacitive coupling between the plates 1212, 1214 is not at a peak and the plates 1212, 1214 are not aligned. When the wire 1210 is aligned with the wire 1206 as shown in FIG. 12B, the capacitive coupling a between the plates 1212, 1214 is at a peak because the plates 1212, 1214 are aligned.

When a command signal 1120 indicating to align the wires 1206, 1210 is received by the controller 1114, the processor 1118 generates control signals 1112 to control the actuator to displace one or both of the devices 1202, 1204 until the position sensor 1106 indicates that the capacitance between the plates 1212, 1214 is at a maximum or that is exceeds a threshold value. Similarly, when a command signal 1120 indicating to misalign the wires is received by the controller 1114, the processor 1118 generates control signals 1112 to control the actuator to displace one or both of the devices 1202, 1204 until the position sensor 1106 indicates that the capacitance between the plates 1212, 1214 is at a minimum or that is below a threshold value. Although the operation of the system 1100 is describe above with reference to FIG. 12 and the alignment (or misalignment) of wires 1206, 1210, embodiments of the invention encompass alignment of other structures, including mechanical structures.

Figure 13:
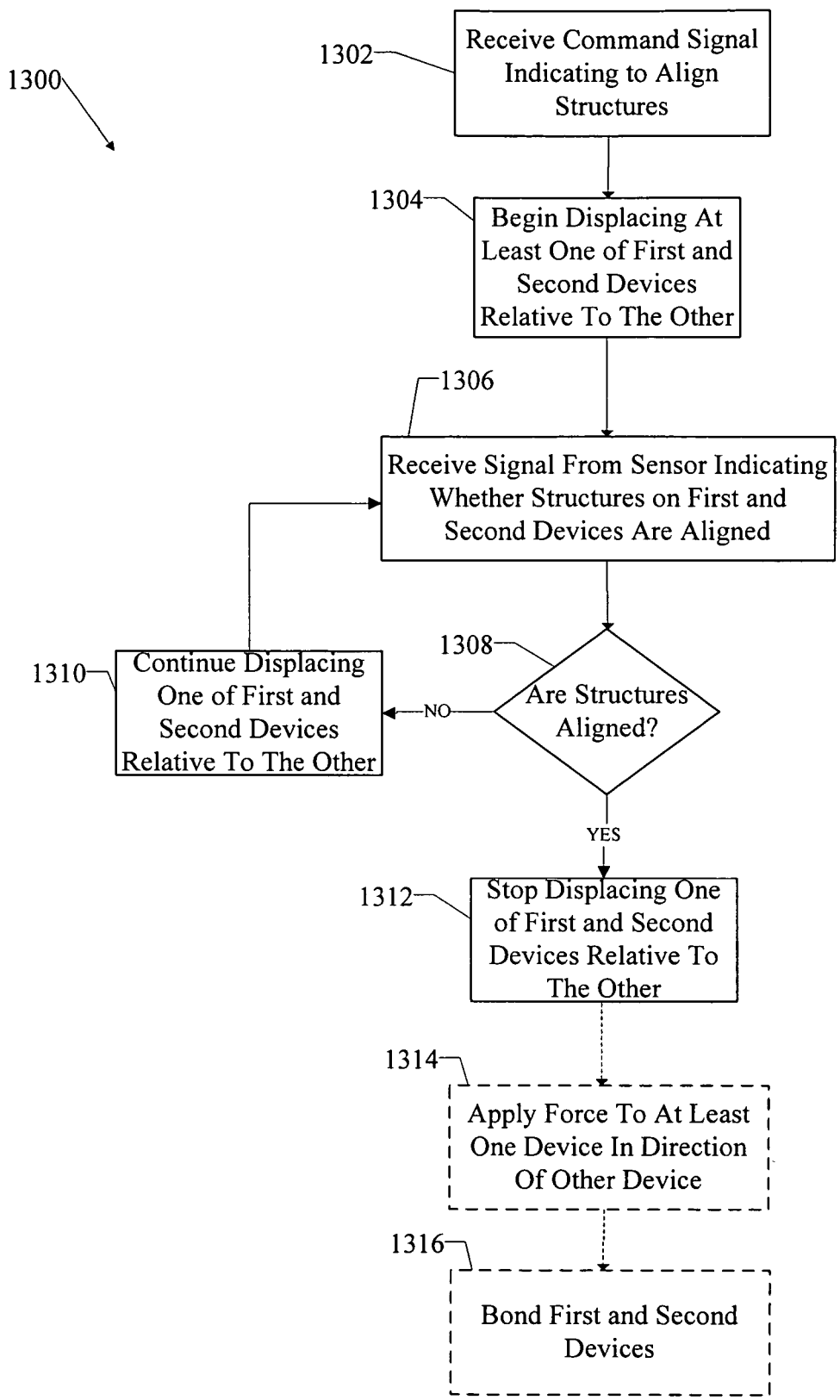
FIGS. 13-14 show flow charts illustrating methods according to embodiments of the invention.

There is shown in FIG. 13 a flow chart 1300 illustrating a method according to an embodiment of the invention that is described with reference to the system 1100 in FIG. 11. A command signal 1120 is received in step 1302 indicating to align structures on the first and second devices 1102, 1104. At least one of the first and second devices 1102, 1104 is displaced relative to the other in step 1304 in response to the command signal 1120. A position information signal 1110 is received in step 1306 indicating whether the structures on the first and second devices are aligned.

As described above, the position information signal 1110 may be generated, for example, based on the coupling of signals between wires on the first and second devices or based on the alignment of other structures such as the plates shown in FIGS. 12A and 12B. For example, the level of coupling may be compared to a threshold level of coupling (e.g., capacitance with regard to FIGS. 12A and 12B). As one or both of the devices are actuated relative to each other, when the level of coupling meets the threshold, the structures are determined to be aligned (as shown in FIG. 12B). If the structures are aligned, as determined in step 1308, the controller 1114 controls the actuator 1108 to stop the displacement of the device(s) in step 1312. If it was determined in step 1308 that the structures are not aligned, the controller 1114 generates a control signal 1112 for the actuator 1108 to continue displacing the device(s) as indicated by step 1310 and receiving the position information signal 1110 indicating whether the wires are aligned in step 1306.

In an embodiment of the invention, the method 1300 includes a further step 1314 as shown in phantom in FIG. 13. Once the structures are aligned, a force may be applied to at least one of the devices in a direction of the other device in step 1314. This force can bring the devices closer together to either connect the structures or to enhance the connection (or coupling) between the structures. In an embodiment of the invention, the method 1300 includes yet another step 1316 as shown in phantom. The first and second devices are bonded or coupled to each other in step 1316. Embodiments of the invention encompass bonding the first and second devices to each other via fusion bonding, solder (or eutectic) bonding or anodic bonding. Embodiments of the invention also encompass bonding the first and second devices to each other using an adhesive, such as an epoxy, applied to at least one of the devices to fixably connect the devices when the applied force brings them together.

Figure 14:
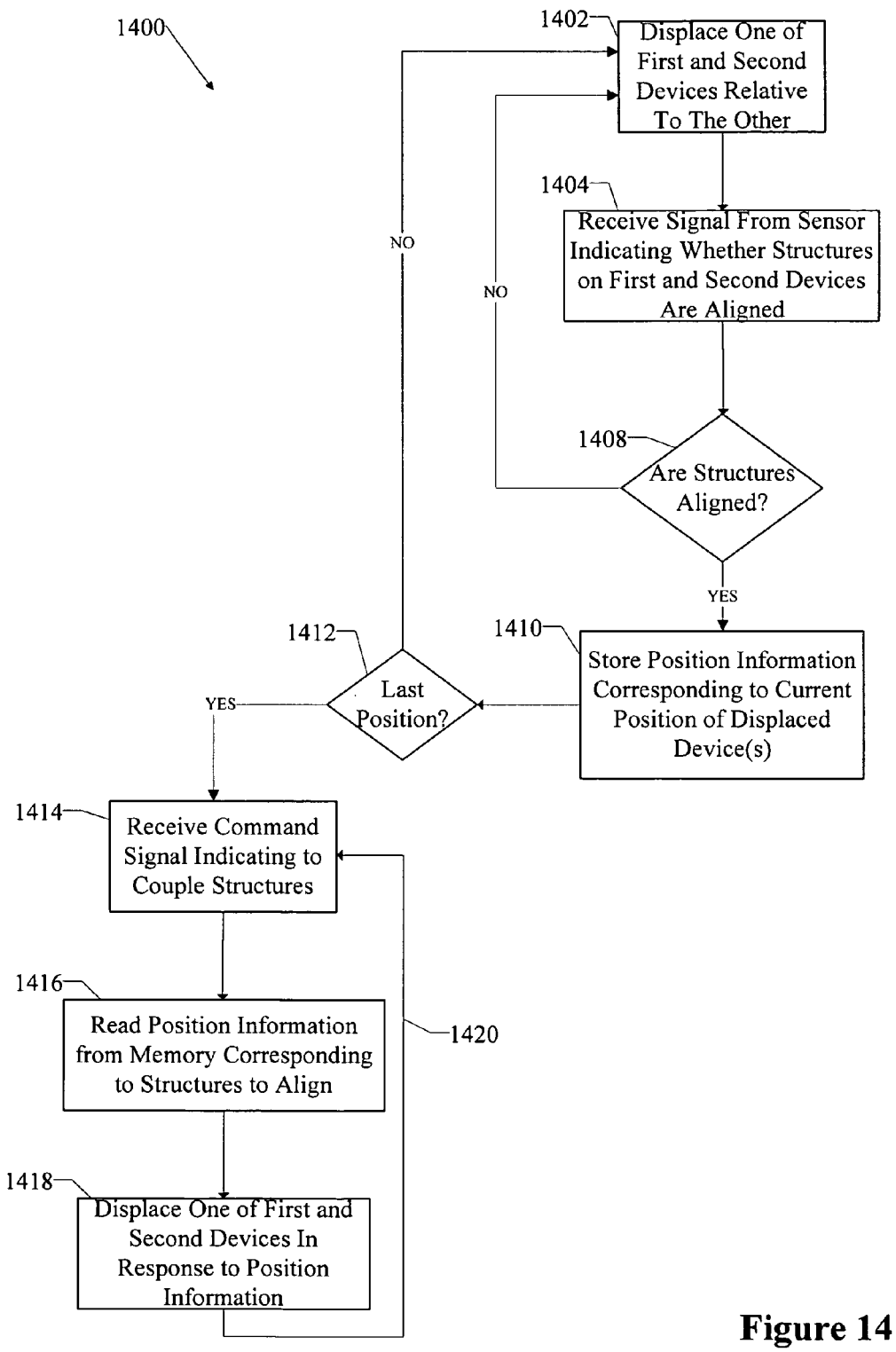

There is shown in FIG. 14 a flow chart 1400 illustrating another method according to an embodiment of the invention that is described with reference to the system 1100 in FIG. 11. The method of FIG. 14 includes an initialization procedure and an alignment procedure. During the initialization procedure, the system 1100 identifies positions where the wires in the first and second devices 1102, 1104 are aligned and stores corresponding position information in a memory 1116. In the alignment procedure, the stored position information is used to control the actuator 1108 to displace the device(s) 1102, 1104 to align the structures on the first and second devices 1102, 1104 in response to a command signal 1120.

In the initialization procedure, at least one of the first and second devices is displaced relative to the other device in step 1402. A position information signal 1110 is received indicating the relative positions of (or the alignment of) the structures on the first and second devices 1102, 1104 in step 1404. If the structures are determined to be aligned (or misaligned depending on the command signal) in step 1408, the position information identifying the position of the displaced device(s) is stored in memory 1116 in step 1410. In an embodiment of the invention, the controller stores position information from the sensor 1106 corresponding to one or more positions of the second device 1104. The controller 1114 can then control the actuator 1108 to displace the second device 1104 in response to the stored position information.

In an embodiment of the invention, the devices are actuated relative to each other using an electrostatic actuator. When a peak (or threshold) level of coupling or alignment between structures (e.g., a pair of wires) is detected, a memory record identifying the structures (e.g., the pair of wires) and the position of the devices is stored in the memory 1116. In an embodiment of the invention, the position of the devices (position information) is stored in the memory in the form of information for controlling the actuator 1108 to displace the devices 1102, 1104 into position where the peak (or threshold) level of coupling or alignment was detected. For an electrostatic actuator, for example, the position information may include activation and/or deactivation sequences for driving the electrodes of the of actuator.

If the structures are determined not to be aligned in step 1408, the device(s) is further displaced until the structures are aligned. After each position is stored, if there are further positions to identify as determined in step 1412, the device(s) is further displaced in step 1402 and the initialization procedure is repeated for each position to be identified.

In an embodiment of the invention, the initialization procedure is performed by moving one of the devices 1102, 1104 relative to the other in small increments. The devices are forced together via a clamping mechanism at each increment. At each increment, the level of coupling between the structures on the respective devices is determined and position information corresponding to the positions with the peak level of coupling are stored in the memory 1116.

Once the positions are identified, the alignment procedure begins by receiving a command signal 1120 in step 1414 indicating which structures to couple to each other. The system reads the position information from the memory 1116 corresponding to the structures indicated in the command signal 1120 in step 1416. The controller 1114 outputs a control signal 1112 to the actuator in response to the stored position information to control the actuator 1108 to position the device 1104 for alignment of the structures on the devices in step 1418. Different structures may then be aligned by receiving another command signal 1120 as indicated by arrow 1420.

Figure 15:
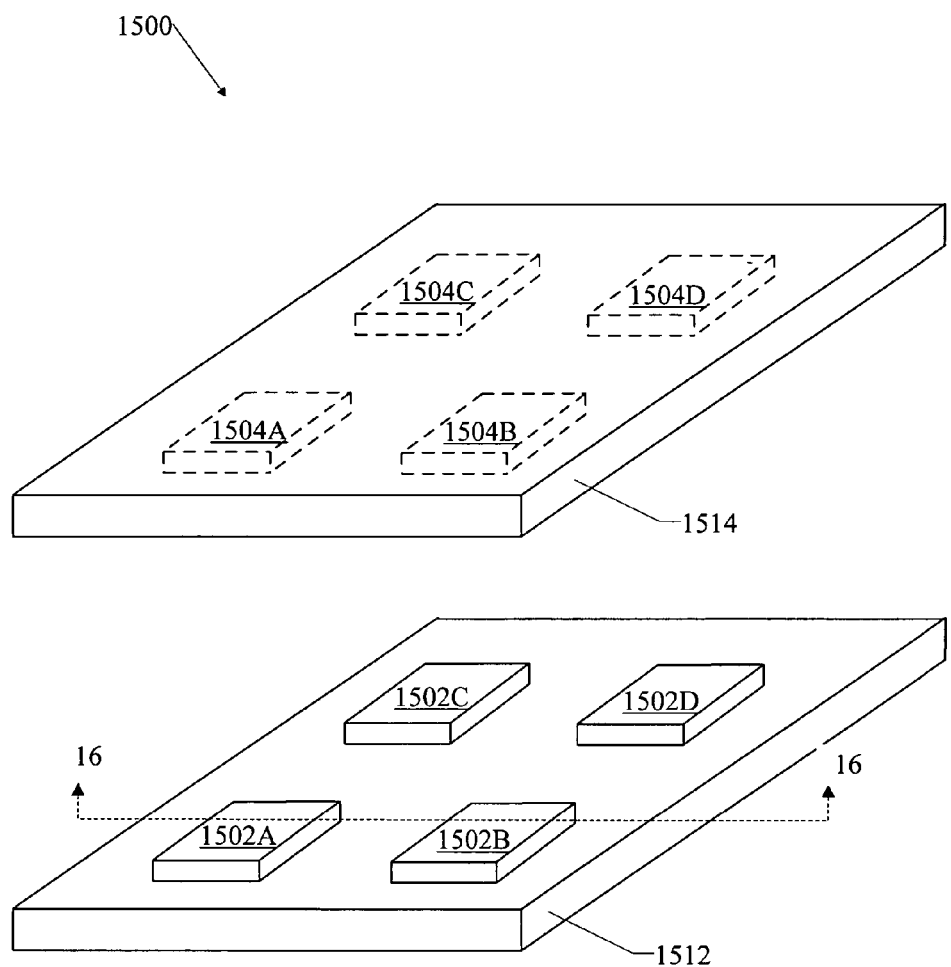
FIG. 15 is an isometric view of a system according to an embodiment of the invention.

There is shown in FIG. 15 a system 1500 including a plurality of devices 1502, 1504 according to an embodiment of the invention. The devices 1502, 1504 are each coupled to a respective substrate 1512, 1514. The first substrate 1512 includes a plurality of devices 1502 that each corresponds to one of the devices 1504 on the second substrate 1514. The first and second substrate 1512, 1514 are brought together to couple (by contact or otherwise) the respective pairs of devices 1502, 1504 together.

Figure 16A:
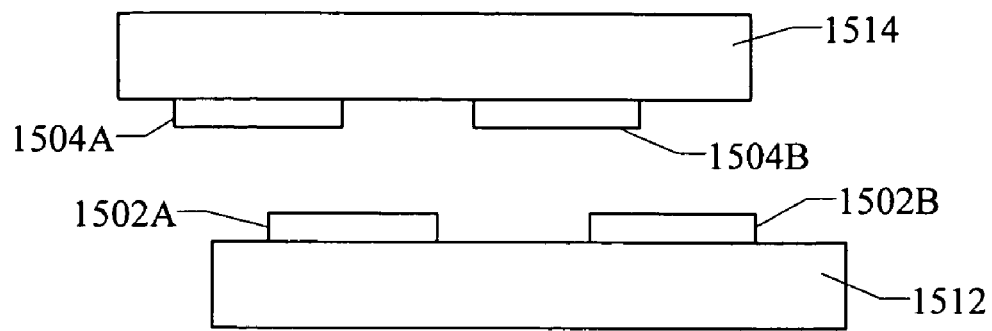
FIG. 16A-C are cross sectional view of the system in FIG. 15 taken along line 16-16.
Figure 16B:
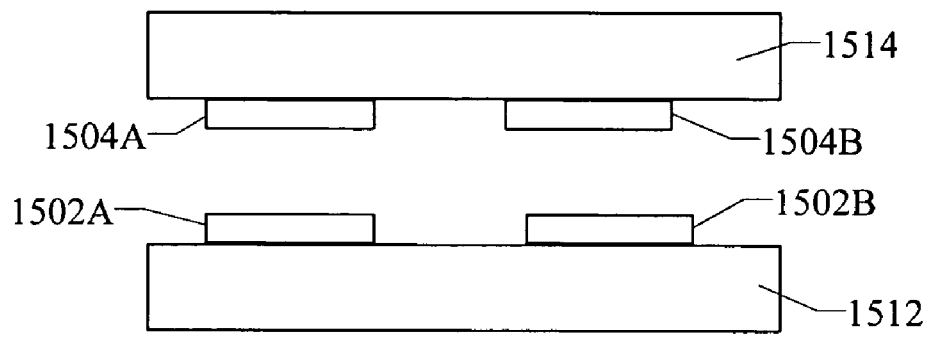
Figure 16C:
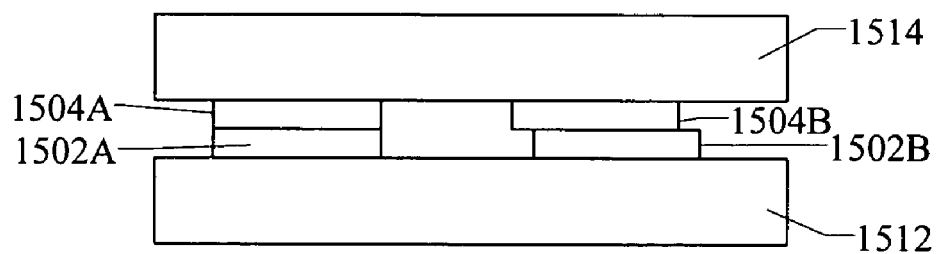

A cross-sectional view of the system 1500 taken along lines 16-16 is shown in FIG. 16A. As shown in FIG. 16A, the first and second substrates 1512, 1514 and their respective devices 1502, 1504 are not in alignment. The substrates 1512, 1514 are aligned as shown in FIG. 16B and are then brought together as shown in FIG. 16C. As illustrated in FIG. 16C, although the substrates 1512, 1514 are aligned when they are brought together, the devices 1502 on the first substrate 1512 are not necessarily aligned with corresponding devices 1504 on the second substrate 1514. Some devices 1502A, 1504A are aligned while other devices 1502B, 1504B are not aligned.

The misalignment may result from manufacturing tolerances that cause the devices 1502, 1504 to be inaccurately positioned on their respective substrates. In an embodiment of the invention, the substrates 1512, 1514 are semiconductor wafers and the devices 1502, 1504 are dies formed on the wafers 1512, 1514. The position or alignment of a die 1502, 1504 on a substrate 1512, 1514 may be imprecise as a result of stepper run-out, drift, or other aberrations resulting from tolerances in the manufacturing process. Thermal expansion may also cause imprecision if there are differences in temperature between the fabrication and bonding (or coupling) processes.

Figure 17:
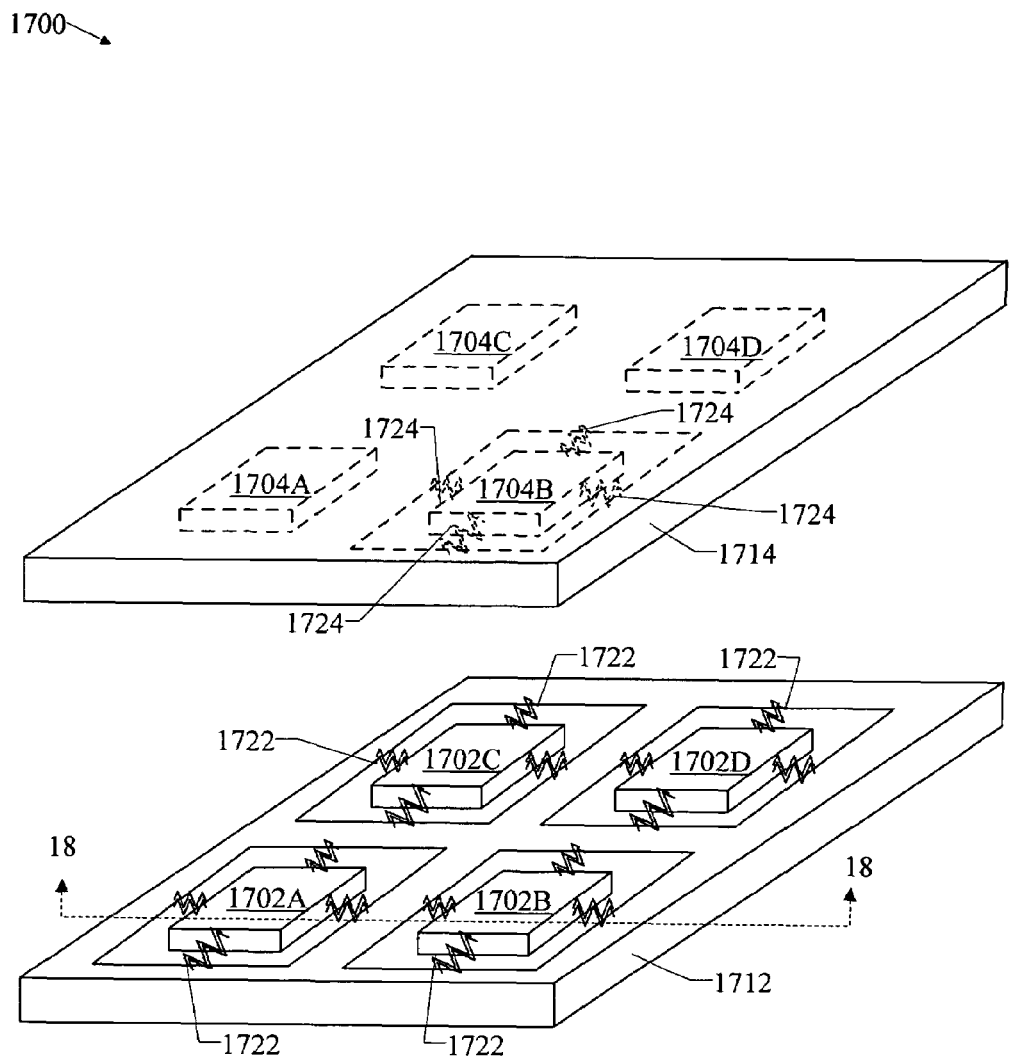
FIG. 17 is an isometric view of a system having a device flexibly coupled to a substrate according to an embodiment of the invention.

In an embodiment of the invention as shown in FIG. 17, one or both of the devices 1702, 1704 may be flexibly coupled to its respective substrate 1712, 1714 and aligned before bonding to its corresponding device 1702, 1704. There is shown in FIG. 17 a system 1700 including a plurality of devices 1702A-D that are each flexibly coupled to a substrate 1712 by flexible connectors 1722. The other substrate 1714 has some devices 1704A, C, D that are fixably coupled to the substrate 1714 and another device 1704B that is flexibly coupled to the substrate 1714 by flexible connectors 1724.

In an embodiment of the invention, the flexible connectors 1722, 1724 are formed by patterning a spring or a spring-like structure 1722, 1724 between the substrates 1712, 1714 and the devices 1702, 1704. In an embodiment of the invention conductors are patterned within or on the flexible connectors 1722, 1724 to conduct signals between the substrates 1712, 1714 and the devices 1702, 1704. Although the devices 1702, 1704 are shown in FIG. 17 with four flexible connectors 1722, 1744 to the substrates 1712, 1714, embodiments of the invention encompass using one or more flexible connectors to flexibly couple the devices 1702, 1704 to the substrates 1712, 1714.

Figure 18A:
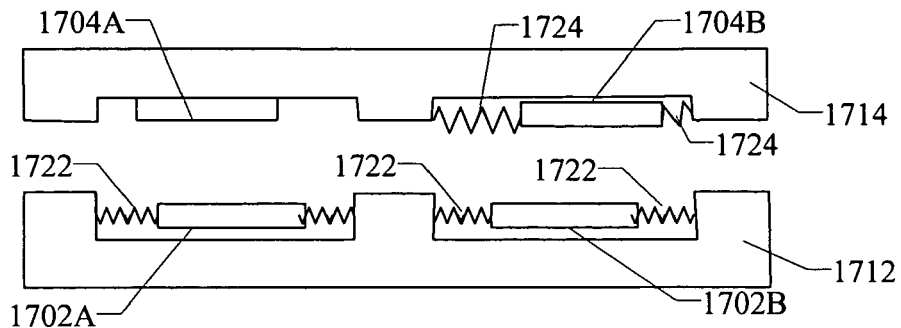
FIG. 18A-D are cross sectional view of the system in FIG. 17 taken along line 18-18.
Figure 18B:
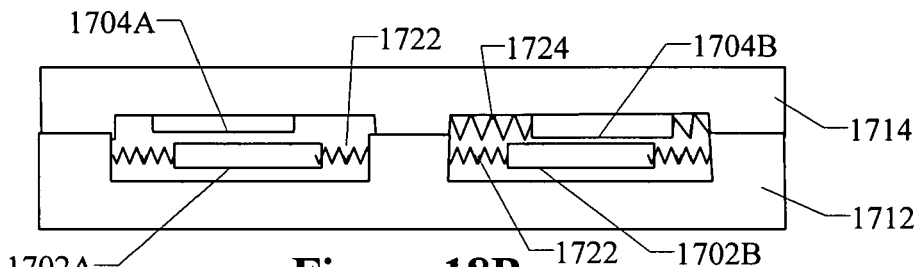

There is shown in FIGS. 18A-D cross-sectional diagrams of the system 1700 taken along line 18-18 in FIG. 17. The system 1700 is illustrated in each of FIGS. 18A-D in a different stage of a process of bonding the devices 1702 from one substrate 1712 to corresponding devices 1704 from another substrate 1714. In FIG. 18A, the substrates 1712, 1714 are shown in position where they have been aligned. In FIG. 18B, the substrates have been brought together although their respective devices 1702, 1704 are shown as being out of alignment.

Figure 18C:
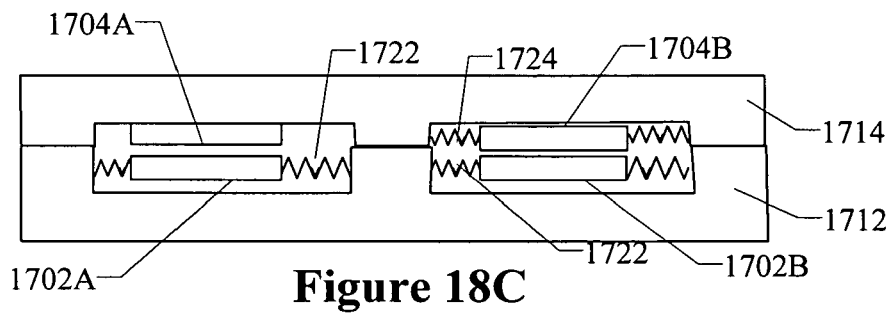

The misalignment of the devices 1702, 1704 may be corrected in the system 1700 because at least one of the devices 1702, 1704 of each pair of devices is flexibly coupled to its respective substrate 1712, 1714. In FIG. 18C, the devices 1702, 1704 have been aligned. In particular, 1702A can be moved to the left and into alignment with device 1704A which is fixed to its respective substrate 1714. Devices 1702B and 1704B can both be flexibly coupled to their respective substrates 1712, 1714 and either or both substrates may be actuated relative to its substrate to put it in alignment with the other device 1702B, 1704B. In this particular embodiment, device 1704B is actuated to the left as seen in the drawing to a position in alignment with device 1702B.

Figure 18D:
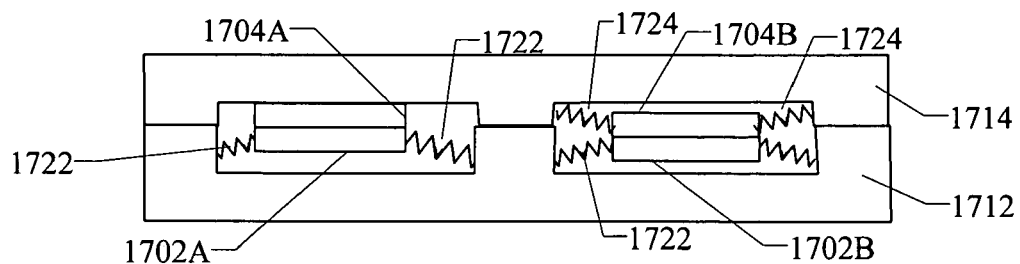

In an embodiment of the invention, the devices 1702, 1704 are positioned with respect to their substrates such that when the substrates 1712, 1714 are brought together, the devices 1702 from one substrate 1712 are not in contact with the devices 1704 from the other substrate 1714. In FIG. 18C, although the substrates 1712, 1714 are brought together, their respective devices 1702, 1704 are still apart. In an embodiment of the invention and as illustrated in FIG. 18D, after the devices 1702, 1704 are aligned, the devices 1702, 1704 are brought together. As discussed above, the devices 1702, 1704 may be brought together to couple structures on corresponding devices either temporarily so they can later be actuated to another position or the devices 1702, 1704 may be brought together and bonded permanently.

Figure 19:
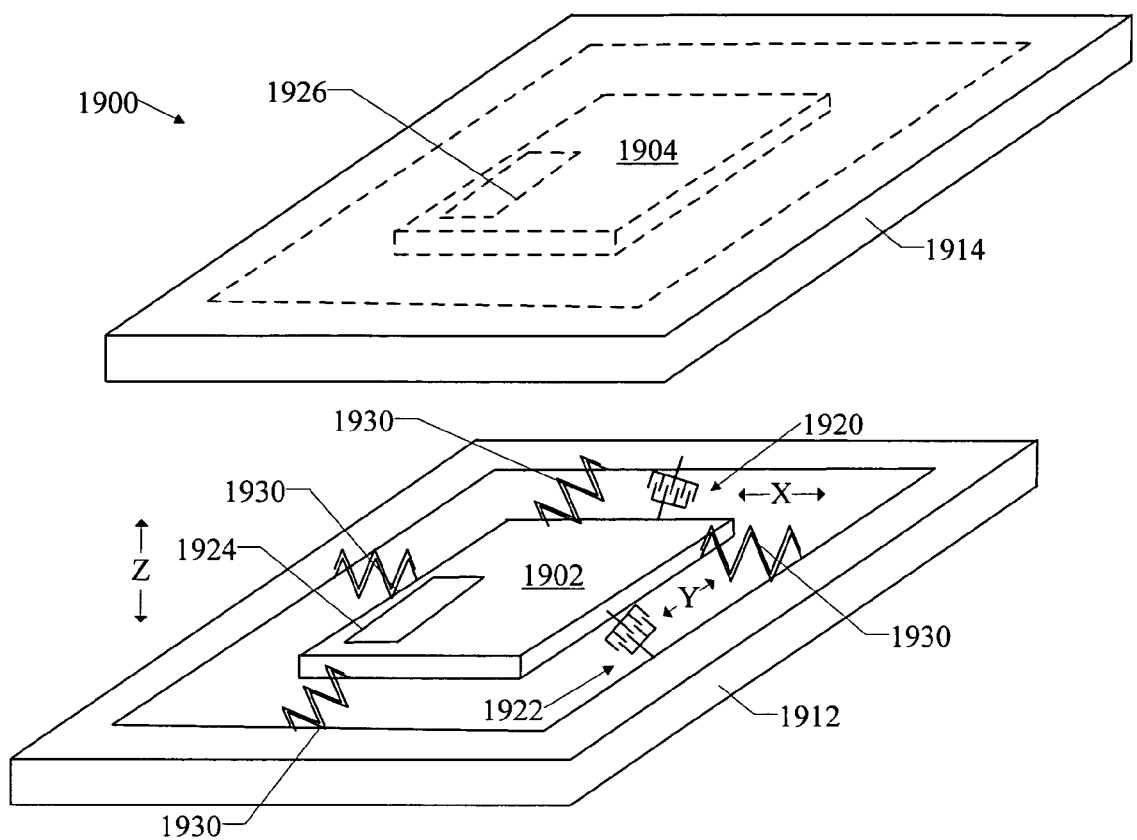
FIGS. 19-20 are isometric views of systems having electrostatic actuators according to embodiments of the invention.

In an embodiment of the invention, the devices are actuated electrostatically. There is shown in FIG. 19 a system 1900 including a first device 1902 flexibly coupled with flexible connectors 1930 to a first substrate 1912 and a second device 1904 fixably coupled to a second substrate 1914. The system 1900 includes a first actuator 1920 for actuating the first device 1902 in a first direction Y and a second actuator 1922 for actuating the first device 1902 in a second direction X. In an embodiment of the invention, the first and second actuators 1920, 1922 are comb drives.

The system 1900 also can include a pair of substantially parallel plates 1924, 1926 for actuating the devices in a Z direction to bring the devices together after the substrates 1912, 1914 are coupled. When opposite potentials are applied to each of the plates 1924, 1926, the plates are attracted together and pull their respective devices 1902, 1904 together.

Figure 20:
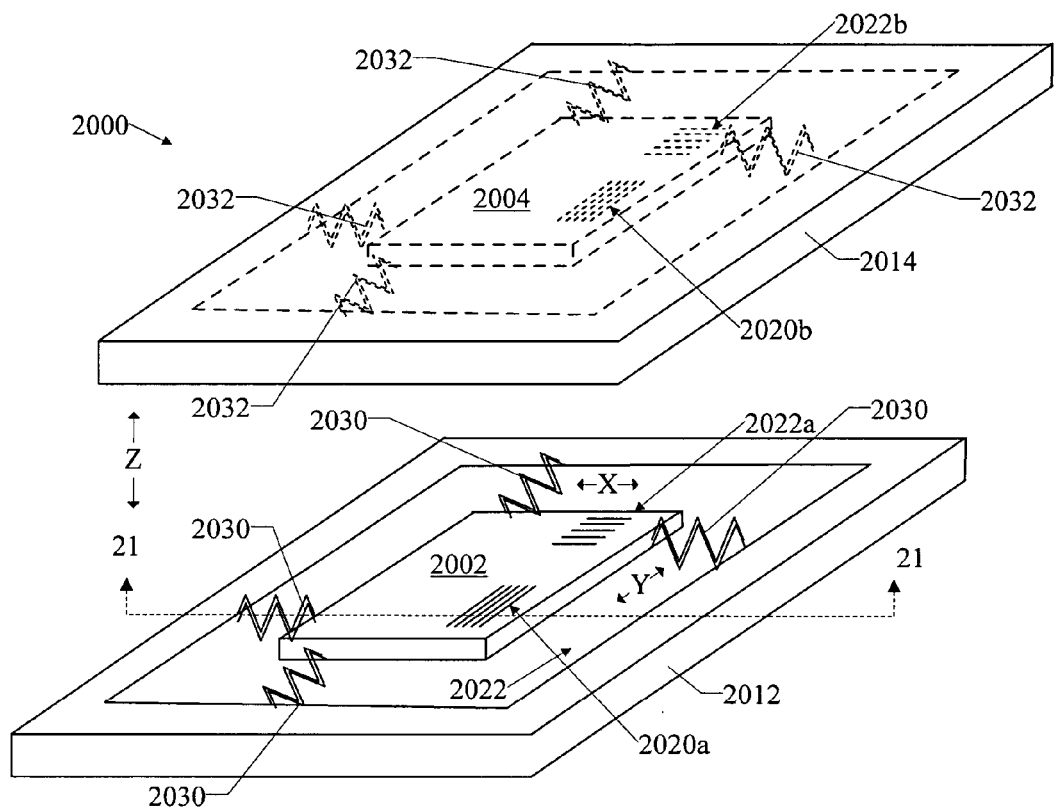

There is shown in FIG. 20 a system 2000 including a first device 2002 flexibly coupled to a first substrate 2012 by connectors 2030 and a second device 2004 flexably coupled to a second substrate 2014 by connectors 2032. The system 2000 includes a first actuator 2020 having electrodes 2020*a* on the first device 2002 and electrodes 2020*b* on the second device 2004 for actuating the first and second devices 2002, 2004 in a first direction X relative to each other. The second actuator 2022 has electrodes 2022*a* on the first device 2002 and electrodes 2022*b* on the second device 2004 for actuating the first and second devices 2002, 2004 in a second direction Y relative to each other.

In an embodiment of the invention, the first and second actuators 2020, 2022 electrostatically actuate the first and second devices 2002, 2004. In an embodiment of the invention, the devices 2002, 2004 form a microelectromechanical system (MEMS) that is electrostatically actuated. In an embodiment of the invention, the actuator is an electrostatically-translatable surface drive as described in by Hoen et al., *A High-Performance Dipole Surface Drive for Large Travel and Force*, The 12th International Conference on Solid State Sensors, Actuators and Microsystems, Jun. 8-12, 2003, 344-347, or described in U.S. Pat. No. 5,986,381, which are incorporated herein by reference. In an embodiment of the invention, the devices 2002, 2004 are actuated with a precision of one nanometer or better relative to each other. In an embodiment of the invention, the devices 2002, 2004 are actuated with a precision of one hundred nanometers or better relative to each other.

Figure 21:
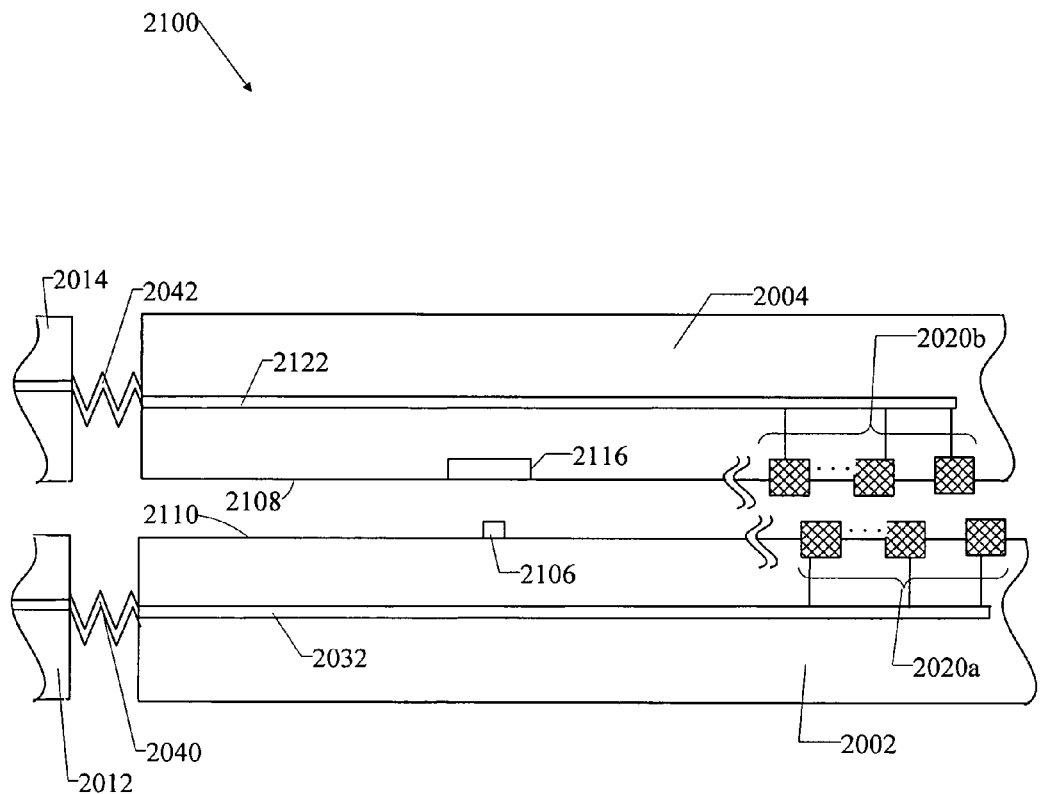
FIG. 21 is a cross-sectional diagram of a portion of the system in FIG. 20 taken along line 21-21.

A cross-sectional diagram of a portion of an exemplary system 2000 taken along line 21-21 is shown in FIG. 21. The system 2000 includes a structure 2106 formed on the surface 2110 of the first device 2002 and a structure 2116 formed within the second device 2004. A plurality of translator electrodes 2020*b* are coupled to the second device 2004 and a plurality of stator electrodes 2020*a* are coupled to the first device 2002. The translator and stator electrodes 2020 form the surface drive that actuates the devices 2002, 2004 in the X direction relative to each other when the electrodes 2020 are activated and/or deactivated in the appropriate sequences. The electrodes 2020 are controlled via a control signal received via the flexible conductors 2040, 2042. In an embodiment of the invention, the flexible conductors 2040, 2042 are incorporated into the flexible connectors 2030, 2032.

In an embodiment of the invention, one or both of the actuators 2020, 2022 also apply a force to the devices 2002, 2004 to bring them together and actuate the devices 2002, 2004 in the Z direction. With reference to FIGS. 18B-D, the electrodes 2020, 2022 are activated and/or deactivated in the appropriate sequences to move the devices 2002, 2004 from their positions in FIG. 18B to their positions in FIG. 18C. Once aligned as shown in FIG. 18C, the electrodes 2020, 2022 on the first and second devices 2002, 2004 that actuated the devices in the X and Y directions are then given an increase in potential to actuate the devices in the Z direction to bring the devices 2002, 2004 together as shown in FIG. 18D.

In an embodiment of the invention, voltages below a first voltage level are applied to the electrodes 2020, 2022 to activate/deactivate the electrodes 2020, 2022 to actuate the devices 2002, 2004 in the X and Y directions. The electrodes 2020, 2022 are then activated with voltages above the first voltage level to actuate the devices 2002, 2004 in the Z direction. In an embodiment of the invention, the force applied by applying the voltages above the first level brings the first and second devices 2002, 2004 together such that their respective electrodes 2020, 2022 are coupled to each other and the pressure or the current flow between the electrodes causes the electrodes 2020*a*, 2022*a* from the first device 2002 to fuse to the electrodes 2020*b*, 2022*b* of the second device 2004, thereby coupling the first device 2002 to the second device 2004.

In a system where the position of the structures is determinative, that is the position of the structures is known based on a command given to an actuator, multiple structures on the devices may be aligned without the initialization procedure described above with reference to FIG. 14. In other words, the position of the structures is known based on the command signal transmitted to the actuator(s) to position the devices. In such a system, structures on the devices may be aligned without a position sensor 1106 (shown in phantom in FIG. 11). For example, when the positions of the electrodes 2020, 2022 (in FIGS. 20, 21) of the system 2000 shown in FIG. 20 are known relative to the position of the structures 2106, 2116 of the first and second devices 2002, 2004, the electrodes may be activated/deactivated in predetermined sequences to align (or misalign) certain structures on the first and second devices 2002, 2004.

Figure 22:
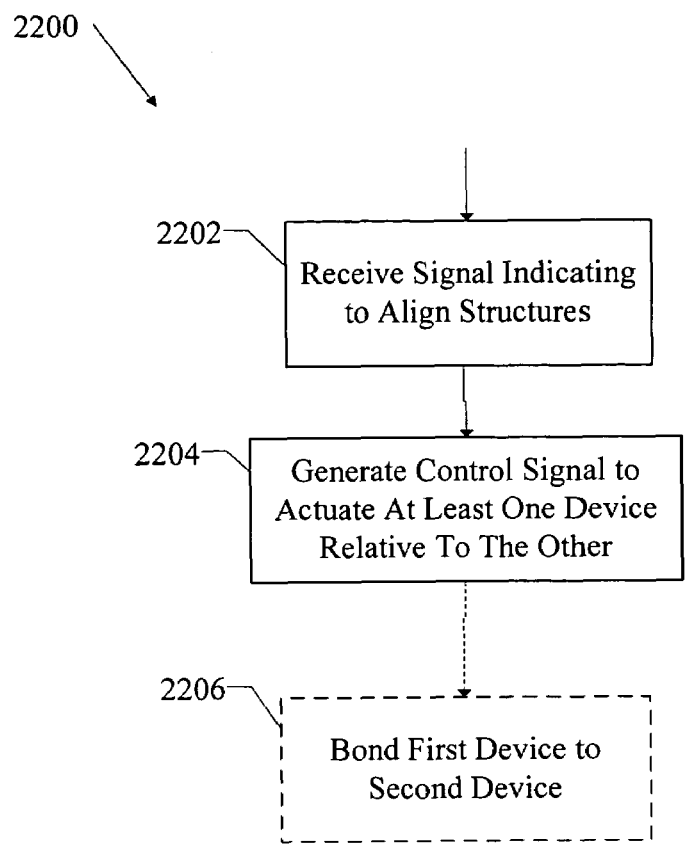
FIG. 22 shows a flow chart illustrating a method according to an embodiment of the invention.

There is shown in FIG. 22 a flow chart 2200 illustrating a method according to an embodiment of the invention for aligning wires in a system where the position of the structures is determinative. With reference to the system 1100 in FIG. 11, the system receives a signal 1120 identifying structures to be aligned in step 2202. The controller 1114 generates a control signal 1112 to an actuator in step 2204 to position the devices to align the identified structures. The first device and the second device may or may not (as illustrated in phantom box) be bonded or coupled to each other in step 2206.

The term "wire" as used herein refers to any substantially electrically-conducting material. In an embodiment of the invention, one or more of the wires are formed of a metal. In another embodiment of the invention, one or more of the wires are formed of a semiconductor material which, through doping or an applied electric field or a combination thereof, is substantially electrically conductive. A wire may be patterned, for example, using optical, x-ray, or imprint lithography techniques and may be fabricated using semiconductor processing techniques such as material deposition and etching.

Although embodiments of the invention are described above as having a second device that is displaceable relative to the first device, embodiments of the invention encompass having a first device displaceable relative to the second device or both first and second devices displaceable relative to each other.

The foregoing describes the invention in terms of embodiments foreseen by the inventors for which an enabling description was available, although insubstantial modifications of the invention, not presently foreseen may nonetheless represent equivalents thereto.

What is claimed is:

1. A system for coupling first and second wires that are micrometer-scale or smaller, the system comprising:
   a first device having a surface, the first wire extending along the surface of the first device;
   a second device for holding the second wire, the second device having a surface opposite the surface of the first device, the second wire extending through the second device to a position in proximity to the surface of the second device; and
   means for sensing alignment between the first and second wires;
   wherein one of the first and second devices is displaceable between first and second positions relative to the other device, and
   wherein the first wire is not substantially electrically coupled to the second wire in the first position; and
   wherein the first wire is closer to the second wire and substantially electrically coupled to the second wire in the second position, the sensing means indicating when the first and second wires are aligned.

2. The system according to claim 1 comprising means, responsive to the sensing means, for translating the first and second devices relative each other until the first and second wires are aligned.

3. The system according to claim 2 wherein the translating means includes an electrostatic actuator.

4. The system according to claim 1 wherein at least one of the first and second devices is linearly displaceable.

5. The system according to claim 1 wherein the geometry scale of the first wire is different from the geometry scale of the second wire.

6. The system according to claim 5 wherein the first wire is a nanometer scale wire and the second wire is a micrometer scale wire.

7. The system according to claim 1 wherein one of the first and second wires is composed substantially of metal.

8. The system according to claim 1 wherein one of the first and second wires is composed substantially of a semiconductor.

9. The system according to claim 1 wherein the first wire extends along the surface of the first device in a position within the device and proximate to the surface of the first device.

10. The system according to claim 1 wherein the first wire extends along the surface of the first device in a position substantially flush with the surface of the first device.

11. The system according to claim 1 wherein the first wire extends along the surface of the first device in a position past the surface of the first device.

12. The system according to claim 1 wherein the first wire contacts the second wire in the second position and does not contact the second wire in the first position.

13. The system according to claim 1 wherein the first wire is separated by a dielectric from the second wire in the second position whereby a signal applied to the first wire is coupled to the second wire in the second position.

14. The system according to claim 13 wherein the signal applied to the first wire is capacitively coupled to the second wire in the second position.

15. The system according to claim 1 comprising a ground plane having an opening wherein the second wire is positioned substantially within the opening of the ground plane.

16. The system according to claim 1 comprising a clamping mechanism for applying a force to one of the first and second devices in a direction toward the other device.

17. The system according to claim 1, wherein the coupling at the second position is permanent.

18. The system according to claim 1 comprising a third wire extending through the second device to a position in proximity to the surface of the second device, wherein the third wire is substantially coupled to the first wire in one of the first and second positions.

19. The system according to claim 18 wherein the third wire is substantially electrically coupled to the first wire in one of the first and second positions.

20. The system according to claim 18 wherein the second wire and the third wire are coupled to each other.

21. The system according to claim 1 comprising a plurality of wires of a micrometer-scale or smaller geometry extending along the surface of the first device and a third device having a surface opposite the surface of the first device and including a micrometer-scale or smaller third wire extending through the third device to a position in proximity to the surface of the third device, wherein one of the first and third devices is displaceable between third and fourth positions relative to the other and the third wire is not substantially coupled to any of the plurality of wires in the third position and the third wire is substantially coupled to one of the plurality of wires in the fourth position.

22. The system according to claim 1 comprising
an actuator for displacing the first and second devices relative to each other; and
a controller, responsive to the sensing means, for controlling the actuator to align the first and second wires.

23. The system according to claim 22 wherein the sensing means includes a sensor for providing position information indicating a position of the second wire relative to the first wire to the controller.

24. The system according to claim 23 wherein the sensor detects coupling of a signal between the first and second wires.

25. The system according to claim 23 comprising a first plate connected to the first device and a second plate connected to the second device wherein the sensor detects capacitive coupling between the first and second plates.

26. The system according to claim 23 comprising a memory for storing position information received from the sensor.

27. The system according to claim 26 wherein the controller is configured to control the actuator to displace the one of the first and second devices in response to the stored position information.

28. The system according to claim 1 wherein the sensing means generates position information indicating whether the first and second wires are aligned.

29. The system according to claim 28 wherein the sensing means is coupled to at least one of the first and second wires for sensing relative position of first and second wires.

30. The system according to claim 28 further comprising means for translating one of the first and second devices between the first and second positions; and means for controlling the translating means in response to the position information.

31. A method of substantially electrically coupling the first and second wires in the system of claim 1, comprising:
displacing the first and second devices relative to each other;
receiving a signal from the sensing means, the signal indicating the relative position of first and second wires; and
determining whether the first and second wires are aligned in response to the signal.

32. The method according to claim 31 comprising sensing current flow from the first wire to the second wire and determining whether the first and second wires are aligned based on the sensed current.

33. The method according to claim 31 comprising electrostatically displacing the first and second devices relative each other.

34. The method according to claim 31 comprising stopping the displacement of the one of the first and second devices if the first and second wires are aligned and continuing the displacement if the first and second wires are not aligned.

35. The method according to claim 31 comprising applying an attractive force between the first and second devices.

36. The method according to claim 31 comprising storing position information in memory if the first and second wires are substantially aligned.

37. A system comprising:
a first device having a micrometer-scale or smaller geometry first conductor;
a second device having a micrometer-scale or smaller geometry second conductor;
an actuator for repositioning the first device between first and second positions relative to the second device such that the first and second conductors are aligned in the first position but not aligned in the second position; and
means for sensing alignment between the first and second conductors and causing the actuator to reposition the first device until the first and second conductors are aligned;
wherein the first and second conductors are substantially coupled and fixed in the first position but not in the second position.

38. The system according to claim 37 wherein geometry scale of the first conductor is different from geometry scale of the second conductor.

39. The system according to claim 37 wherein the first and second conductors conduct optical signals.

40. The system according to claim 37 further comprising a clamping mechanism for applying an attractive force between the first and second devices.

41. The system according to claim 37 further comprising a controller for controlling the actuator to translate the first device.

42. A method of substantially electrically coupling the first and second conductors in the system of claim 37, comprising:
receiving a signal identifying one of the first and second conductors;
reading position information from memory corresponding to the conductor identified; and
displacing one of the first and second devices in response to the position information.

43. The method according to claim 42 applying an attractive force between the first and second devices.

44. The method according to claim 42 comprising displacing one of the first and second devices relative to the other device.

45. The method according to claim 44 comprising electrostatically displacing one of the first and second devices relative to the other device.

46. A method of conducting signals between the first and second devices of claim 37, comprising:
receiving a command signal indicating to align the first and second conductors;
generating a control signal in response to the command signal; and
causing the actuator to align the first and second conductors in response to the control signal.

47. The method according to claim 46 comprising sensing conduction of signals between the first and second conductors and determining whether the first and second conductors are substantially aligned based on the sensed signal conduction.

48. The method according to claim 46 comprising determining whether the first and second conductors are substantially aligned and generating the control signal in response to the determination.

49. The method according to claim 46 comprising reading position information from memory in response to the command signal and generating the control signal in response to the position information.

50. The method according to claim 46 comprising coupling the first and second devices to each other.

51. A system comprising:
a first device carrying micrometer-scale or smaller geometry first means for conducting signals;
a second device carrying micrometer-scale or smaller geometry second means for conducting signals;
third means for translating without deforming the first and second devices relative to each other between first and second positions such that the first and second conductor means are moved closer together from non-alignment to alignment;
fourth means for sensing relative position of the first and second means; and
fifth means for controlling the third means in response to the sensed relative position;
wherein signals are substantially coupled between the first and second means in the second position and not in the first position.

* * * * *